(12) United States Patent
Baek et al.

(10) Patent No.: US 8,869,089 B2
(45) Date of Patent: Oct. 21, 2014

(54) SEMICONDUCTOR INTEGRATED CIRCUIT AND METHOD OF DESIGNING THE SAME

(71) Applicants: Sang-hoon Baek, Seoul (KR); Jae-woo Seo, Daegu (KR)

(72) Inventors: Sang-hoon Baek, Seoul (KR); Jae-woo Seo, Daegu (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/708,066

(22) Filed: Dec. 7, 2012

(65) Prior Publication Data

US 2013/0263077 A1  Oct. 3, 2013

(30) Foreign Application Priority Data

Mar. 30, 2012 (KR) ........................ 10-2012-0033345

(51) Int. Cl.
*G06F 17/50* (2006.01)
(52) U.S. Cl.
CPC .................................. *G06F 17/5081* (2013.01)
USPC .......................................................... 716/122
(58) Field of Classification Search
USPC .................................................. 716/100, 122
See application file for complete search history.

(56) References Cited

U.S. PATENT DOCUMENTS

| | | | |
|---|---|---|---|
| 6,417,529 B1 * | 7/2002 | Tanaka | 257/202 |
| 7,315,994 B2 | 1/2008 | Aller et al. | |
| 7,814,456 B2 * | 10/2010 | Gupta et al. | 716/100 |
| 7,908,573 B2 * | 3/2011 | Lin | 716/54 |
| 7,966,596 B2 * | 6/2011 | Lu et al. | 716/119 |
| 8,635,583 B2 * | 1/2014 | Gupta et al. | 716/139 |
| 2002/0077798 A1 * | 6/2002 | Inoue et al. | 703/19 |
| 2003/0229860 A1 * | 12/2003 | Li | 716/1 |
| 2005/0138593 A1 | 6/2005 | Okumura | |
| 2006/0110837 A1 * | 5/2006 | Gupta et al. | 438/14 |
| 2008/0021689 A1 | 1/2008 | Yamashita et al. | |
| 2009/0144686 A1 * | 6/2009 | Lensing et al. | 716/10 |
| 2010/0058267 A1 * | 3/2010 | Lu et al. | 716/9 |
| 2011/0283245 A1 | 11/2011 | Shen et al. | |
| 2011/0302543 A1 * | 12/2011 | Izuha | 716/113 |
| 2012/0084745 A1 * | 4/2012 | Liu et al. | 716/127 |
| 2012/0102441 A1 * | 4/2012 | Aton et al. | 716/54 |

FOREIGN PATENT DOCUMENTS

| | | |
|---|---|---|
| JP | 08107150 A | 4/1996 |
| JP | 2011238713 A | 11/2011 |
| KR | 20080045517 A | 5/2008 |
| KR | 100843900 B1 | 7/2008 |
| KR | 20080073392 A | 8/2008 |

* cited by examiner

*Primary Examiner* — Suchin Parihar
(74) *Attorney, Agent, or Firm* — Harness, Dickey & Pierce, P.L.C.

(57) ABSTRACT

According to example embodiments of inventive concepts, a method of designing a semiconductor integrated circuit includes: creating a marking layer that indicates at least one semiconductor device of a plurality of semiconductor devices that is to be changed in at least one of width, height, and space thereof from an adjacent semiconductor device; and applying the marking layer to a previously created layout to generate a new library of the at least one semiconductor device that is changed in at least one of width, height, and space from an adjacent semiconductor device. The marking layer may be based on a change in characteristics of the at least one semiconductor device of the plurality of semiconductor devices.

23 Claims, 20 Drawing Sheets

SEMICONDUCTOR INTEGRATED CIRCUIT AND METHOD OF DESIGNING THE SAME

CROSS-REFERENCE TO RELATED APPLICATIONS

This application claims the benefit of Korean Patent Application No. 10-2012-0033345, filed on Mar. 30, 2012, in the Korean Intellectual Property Office, the disclosure of which is incorporated herein in its entirety by reference.

BACKGROUND

Example embodiments of inventive concepts relate to semiconductor integrated circuits, and more particularly, to a semiconductor integrated circuit, and/or a method of designing the same.

Semiconductor integrated circuit (IC) design is a process of converting a chip behavior model that describes desired operations of a semiconductor system to a specific structure model that describes a connection between essential components of the semiconductor system. In such a semiconductor IC design, process generation and use of a library of cells to be included in the semiconductor IC may be advantageous in terms of time and reducing cost in semiconductor IC design and implementation.

SUMMARY

Example embodiments of inventive concepts relate to a semiconductor integrated circuit (IC) design method in which, with a change in characteristics of a semiconductor device, a new library may be rapidly created without creating a new layout.

Example embodiments of inventive concepts relate to a semiconductor IC design method in which, with a change in characteristics of a fin field-effect transistor (fin FET), a new library may be rapidly created without changing a layout.

Example embodiments of inventive concepts relate to a semiconductor IC that may be manufactured using a new library that, even with a change in characteristics of a semiconductor device, may be rapidly created without creating a new layout.

Example embodiments of inventive concepts relate to a semiconductor IC that may be manufactured using a new library that, even with a change in characteristics of a fin FET, may be rapidly created without creating a new layout.

Example embodiments of inventive concepts relate to a computer-readable recording medium for executing a semiconductor IC design method in which, with a change in characteristics of a semiconductor device, a new library may be rapidly created without creating a new layout.

Example embodiments of inventive concepts relate to a storage medium configured to store a new library that, even with a change in characteristics of a semiconductor device, may be rapidly created without creating a new layout.

Example embodiments of inventive concepts relate to an apparatus for designing a semiconductor IC that may rapidly create a new library, even with a change in characteristics of a semiconductor device, without creating a new layout.

According to example embodiments of inventive concepts, a method of designing a semiconductor integrated circuit includes: creating a marking layer that indicates at least one semiconductor device of a plurality of semiconductor devices that is to be changed in at least one of width, height, and space thereof from an adjacent semiconductor device of the plurality of semiconductor devices; and applying the marking layer to a previously created layout to generate a new library of the at least one semiconductor device that is changed in at least one of width, height, and space from an adjacent semiconductor device. The marking layer may be based on a change in characteristics of the at least one semiconductor device of the plurality of semiconductor devices.

The change in characteristics of the at least one semiconductor device may be a change in at least one of electrical and thermal characteristics of the at least one semiconductor device of the plurality of semiconductor devices.

According to the created new library, the plurality of semiconductor devices may have a constant pitch even when the width of the at least one semiconductor device is changed.

The creating of the marking layer may include at least one of: creating a first marking layer that indicates the at least one semiconductor device; and creating a second marking layer that indicates a cell including the at least one semiconductor device. The creating of the second marking layer may include creating the second marking layer that indicates a boundary of the cell.

The at least one semiconductor device may include a fin field-effect transistor (fin FET) including a plurality of active fins. The creating of the marking layer may include creating a marking layer indicating at least one active fin of the plurality of active fins that is to be changed in width. The creating of the marking layer may include at least one of: creating a first marking layer indicating the at least one active fin; and creating a second marking layer indicating a cell including the at least one active fin. According to the created new library, the plurality of active fins may have a constant pitch even when the width of the at least one active fin is changed.

The at least one semiconductor device may include a fin field-effect transistor (fin FET) including a single active fin.

The plurality of semiconductor devices may include a plurality of fin transistors. The plurality of fin transistors may have different threshold voltages. The creating of the marking layer may include creating a marking layer indicating at least one fin transistor of a plurality of fin transistors that is to be changed in width, based on the different threshold voltages. The creating of the marking layer may include at least one of: creating a first marking layer indicating the at least one fin transistor of the plurality of fin transistors; and creating a second marking layer indicating a cell including the at least one fin transistor.

The at least one fin transistor of the plurality of fin transistors may include a plurality of active fins, and the creating of the marking layer may include creating a marking layer indicating at least one active fin of a plurality of active fins that is to be changed in width, based on the different threshold voltages. The creating of the marking layer may include: creating a first marking layer indicating the at least one active fin; and creating a second marking layer indicating a cell including the at least one active fin. According to the created new library, the plurality of active fins may have a constant pitch even when the width of the at least one active fin is changed.

The method may further include, before creating of the marking layer, determining a variation in characteristics of the at least one semiconductor device of the plurality of semiconductor devices based on at least one of a design rule and design constraints.

The method may further include, before the creating of the marking layer, providing the layout for manufacturing the plurality of semiconductor devices.

According example embodiments of inventive concepts, a method of designing a fin transistor, the method including: creating a marking layer indicating at least one fin transistor of a plurality of fin transistors that is to be changed in at least one of width, height, and space thereof from an adjacent fin transistor, based on a change in characteristics of the at least one fin transistor; and applying the marking layer to a previously created layout to generate a new library of the at least one fin transistor that is changed in at least one of width, height, and space from an adjacent fin transistor.

According to example embodiments of inventive concepts, a semiconductor integrated circuit includes a plurality of semiconductor devices. The plurality of semiconductor devices include at least one semiconductor device having at least one of width, height, and space from an adjacent semiconductor device that is changed based on a new library using a marking layer created based on a change in characteristics of the at least one semiconductor device.

The marking layer may indicate the at least one semiconductor device that is to be changed in at least one of width, height, and space thereof from the adjacent semiconductor device, based on a change in characteristics of the at least one semiconductor device.

The change in characteristics of the at least one semiconductor device may be a change in at least one of electrical and thermal characteristics of the at least one semiconductor device.

The new library may be created by applying the marking layer to a previously created layout to change the width of the at least one semiconductor device.

According to the new library, the plurality of semiconductor devices may have a constant pitch even when the width of the at least one semiconductor device is changed.

The marking layer may include at least one of: a first marking layer that indicates the at least one semiconductor device; and a second marking layer that indicates a cell including the at least one semiconductor device.

The at least one semiconductor device may include a fin field-effect transistor (FET) including a plurality of active fins. The marking layer may indicate at least one of the plurality of active fins that is to be changed in width.

The at least one semiconductor device may include a fin field-effect transistor (FET) including a single active fin.

The plurality of semiconductor devices may include a plurality of fin transistors. The plurality of fin transistors may have different threshold voltages. The marking layer may indicate at least one of a plurality of fin transistors that is to be changed in width, based on the different threshold voltages.

The semiconductor integrated circuit may be integrated as a System on Chip (SoC).

According to example embodiments of inventive concepts, a semiconductor integrated circuit includes a plurality of fin transistors. The plurality of fin transistors may include at least one fin transistor having at least one of width, height, and space from an adjacent fin transistor that is changed based on a new library using a marking layer created based on a change in characteristics of the at least one fin transistor.

According to example embodiments of inventive concepts, a tangible computer-readable recording medium having embodied thereon a program for executing a method of designing a semiconductor integrated circuit, the method including: creating a marking layer indicating at least one of a plurality of semiconductor devices that is to be changed in at least one of width, height, and space thereof from an adjacent semiconductor device, based on a change in characteristics of the at least one semiconductor device; and applying the marking layer to a previously created layout to generate a new library of the at least one semiconductor device that is changed in at least one of width, height, and space from an adjacent semiconductor device.

According to example embodiments of inventive concepts, a tangible computer-readable storage medium is configured to store at least one cell library usable by a computer in designing a semiconductor integrated circuit, wherein the cell library is created by creating a marking layer indicating at least one of a plurality of semiconductor devices that is to be changed in at least one of width, height, and space thereof from an adjacent semiconductor device, based on a change in characteristics of the at least one semiconductor device, and applying the marking layer to a previously created layout.

According to example embodiments of inventive concepts, a layout of a semiconductor integrated circuit, the layout stored on a tangible-computer-readable recording medium, includes: a plurality of semiconductor device; and a marking layer applied to layout to indicate at least one semiconductor device of the plurality of semiconductor devices that is to be changed in at least one width, height, and space thereof from an adjacent semiconductor device of the plurality of semiconductor device, the marking layer being based on a change in characteristics of the at least one semiconductor device.

According to example embodiments of inventive concepts, an apparatus for designing a semiconductor integrated circuit includes: a layout design unit configured to design a layout of the semiconductor integrated circuit; and a library design unit configured to create a marking layer indicating at least one of a plurality of semiconductor devices that is to be changed in at least one of width, height, and space thereof from an adjacent semiconductor device, based on a change in characteristics of the at least one semiconductor device. The library design unit may be configured to apply the marking layer to the layout to create a new library.

The library design unit may include: a marking layer creation unit configured to create the marking layer; a library creation unit configured to apply the marking layer to the previously created layout to generate the new library of the at least one semiconductor device that is changed in at least one of width, height, and space from an adjacent semiconductor device; and a library verification unit configured to verify whether the new library satisfies a desired (or alternatively preset) requirement. The library design unit may further include: a layout database configured to store the layout designed by the layout design unit; and a library database configured to store the library verified in the library verification unit.

The apparatus may further include: a system design unit configured to design a system including the semiconductor integrated circuit; a function design unit configured to design functions required for the semiconductor integrated circuit based on the system; and a logic circuit design unit configured to design logic circuits of the semiconductor integrated circuit based on the required functions.

According to example embodiments of inventive concepts, a method of designing a semiconductor integrated circuit includes: accessing a layout that includes a plurality of semiconductor devices; creating a marking layer that indicates a dimensional change to at least one semiconductor device of the plurality of semiconductor devices; and applying the marking layer to the layout to generate a new library of the at least one semiconductor device having a dimensional change.

The plurality of semiconductor devices in the layout may be a plurality of fin-field effect transistors (fin FETs). The plurality of fin-field effect transistors (fin FETs) may each include a plurality of active fins. The creating the marking layer may include: creating a first marking layer that indicates a dimensional change to at least one of the plurality of active fins of a selected fin FET among the plurality of fin FETs, and creating a second marking layer that that indicates a cell of the layout that includes the selected fin FET among the plurality of fin FETs.

The plurality of semiconductor devices in the layout may be a plurality of fin-field effect transistors (fin FETs). The plurality of fin-field effect transistors (fin FETs) may each include one active fin. The creating the marking layer may include: creating a first marking layer that indicates a dimensional change to the active fins of a selected fin FET among the plurality of fin FETs, and creating a second marking layer that that indicates a cell of the layout that includes the selected fin FET among the plurality of fin FETs.

The dimensional change to the at least one semiconductor device of the plurality of semiconductor devices that is indicated by the marking layer may correspond to a change in at least one of width, height, and space thereof from an adjacent semiconductor device.

The plurality of semiconductor devices may have a constant pitch before and after the dimensional change to the least one semiconductor device of the plurality of semiconductor devices.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF THE EMBODIMENTS

Figure 1:
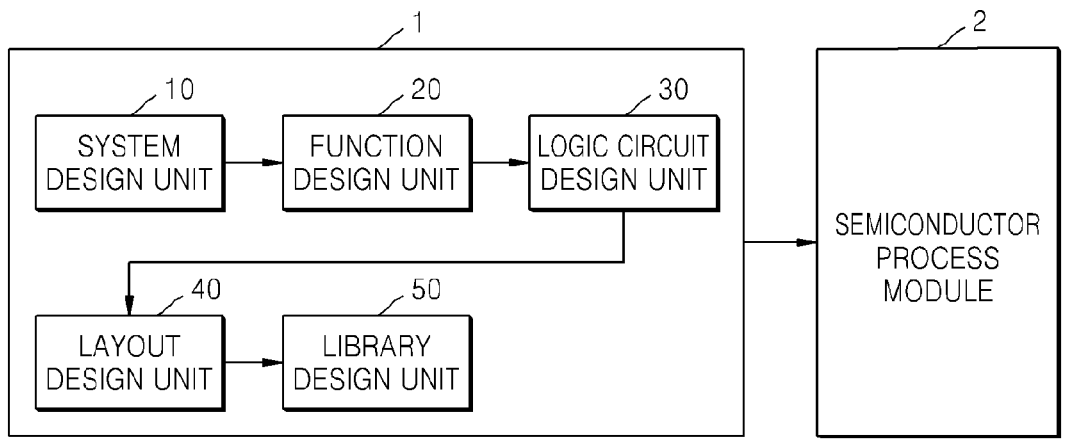
FIG. 1 is a schematic block diagram of a semiconductor integrated circuit (IC) design apparatus according to example embodiments of inventive concepts.

As used herein, the term "and/or" includes any and all combinations of one or more of the associated listed items. Expressions such as "at least one of," when preceding a list of elements, modify the entire list of elements and do not modify the individual elements of the list.

Example embodiments of inventive concepts will now be described more fully with reference to the accompanying drawings, in which some example embodiments are shown. Example embodiments may, however, be embodied in many different forms and should not be construed as being limited to the embodiments set forth herein; rather, these embodiments are provided so that this disclosure will be thorough and complete, and will fully convey the scope of example embodiments of inventive concepts to one of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

Unless otherwise defined, all terms (including technical and scientific terms) used herein have the same meaning as commonly understood by one of ordinary skill in the art to which example embodiments of inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

FIG. 1 is a schematic block diagram of a semiconductor integrated circuit (IC) design apparatus 1 according to example embodiments of inventive concepts.

Referring to FIG. 1, the semiconductor IC design apparatus 1 may include a system design unit 10, a function design unit 20, a logic circuit design unit 30, a layout design unit 40, and a library design unit 50. A design result provided from the semiconductor integrated circuit design apparatus 1 may be transferred to a semiconductor process module 2 and be implemented as a semiconductor integrated circuit.

The system design unit 10 may design a system including a semiconductor integrated circuit. That is, the system design unit 10 may select a system including a semiconductor integrated circuit, for example, a memory system, a computing system, or a communication system. Hereinafter, for convenience of explanation, the semiconductor integrated circuit design apparatus 1 will be described with regards to designing a memory system.

The function design unit 20 may design functions for the semiconductor integrated circuit based on a target system to be designed. In particular, if the target system to be designed is a memory system, which requires a memory device and a memory controller for controlling the memory device, the function design unit 20 may design functions executed by (and/or required by) the memory controller.

The logic circuit design unit 30 may design logic circuits for the semiconductor integrated circuit based on the desired (and/or required) functions of the system. For example, the logic circuit design unit 30 may design logic circuits based on the desired (and/or required) functions for the memory controller, for example, an OR gate, a AND gate, and a flip flop.

The layout design unit 40 may design a layout of the semiconductor integrated circuit based on the logic circuits. In particular, the layout design unit 40 may design a layout according to the logic circuits, for example, an OR gate, an AND gate, and a flip flop. The layout represents arrangement and wiring states of devices in the semiconductor integrated circuit.

Such a layout design process is becoming more time- and cost-consuming with more recent rapid advances in the high integration of semiconductor devices. Thus, as a kind of time- and cost-effective technology, a standard cell-based layout design technique may be used. In the standard cell-based layout design technique, after being designed in advance and stored in a computer system, repeatedly used devices such as an OR gate or an AND gate are appropriately arranged and connected via wiring in layout design, so that the time required for the layout design may be reduced.

The library design unit 50 may design a library of the semiconductor integrated circuit based on the layout. In particular, the library design unit 50 may design a cell library of cells included in the semiconductor integrated circuit. According to example embodiments of inventive concepts, the library design unit 50 may create a marking layer for a semiconductor device that indicates a semiconductor device of which a width is to be changed, based on a change in electrical or thermal characteristics of the semiconductor device, and apply the created marking layer to the previously created existing layout, thereby creating a new library. In the creating of the new library, despite changing a characteristic in the semiconductor device, the time and cost consumption in designing a semiconductor integrated circuit may be significantly reduced because of the use of the previously created existing layout. The library design unit 50 will be described in greater detail below with reference to FIG. 3.

A library means a set of associated files, in which names, dimensions, gate widths, pins, delay characteristics, leakage currents, threshold voltages, and functions of cells may be defined. A general cell library set may include a basic cell, such as AND, OR, NOR, and inverter, a complex cell such as OAI (OR/AND/INVERTER) and AOI (AND/OR/INVERTER), and a storage element such as a simple master-slave flip-flop and a latch.

According to example embodiments of inventive concepts, the cell library may be a standard cell library. In a method using a standard cell library, logic circuit blocks (or cells) with multiple functions are prepared in advance, and then are arbitrarily combined to design a large-scale integrated circuit (LSI) satisfying a customer's or a user's specifications. These previously created existing cells are registered with a computer through verification, and then are subjected to logic design, arrangement, and a wiring process through combination of the cells with a computer-aided design (CAD).

In particular, in designing or manufacturing an LSI, if previously created existing standard logic circuit blocks (or cells) are stored in a library, appropriate logic circuit blocks for the purpose of the design may be chosen from the library, and arranged on a chip in a plurality of cell rows, and then an optimal wiring with a shortest wiring length may be laid out in a wiring space between cells, thereby completing the manufacture of the LSI. The more different types of cells are in the library, the designing may become more flexible, and it becomes more likely to optimally design a chip.

Such an IC using a standard cell is a kind of semi-order-made IC, which may be manufactured by selection of previously created existing standard cells stored in a library and arrangement and minimal wiring of the standard cells. Thus, development costs and a development period may be reduced as compared with full custom-made ICs.

Figure 2:
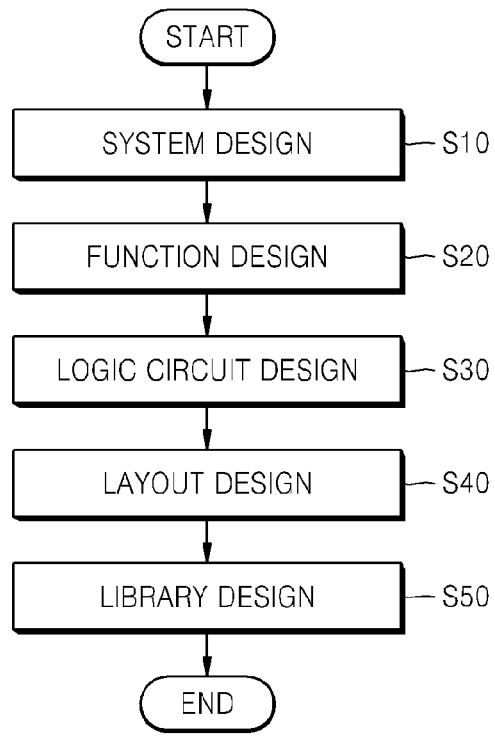
FIG. 2 is a schematic flowchart of a method of designing a semiconductor IC, according to example embodiments of inventive concepts.

FIG. 2 is a schematic flowchart of a method of designing a semiconductor IC, according to example embodiments of inventive concepts.

Referring to FIG. 2, the semiconductor IC design method includes sequential operations performed by the semiconductor IC design apparatus 1 of FIG. 1. A detailed description of the semiconductor IC design apparatus 1 of FIG. 1, which is provided above, applies to the semiconductor IC design method according to example embodiments of inventive concepts.

In operation S10, a system including a semiconductor IC is designed.

In operation S20, functions required for the semiconductor IC are designed based on the designed system.

In operation S30, logic circuits to be included in the semiconductor IC circuit are designed based on their functions.

In operation S40, a layout of the semiconductor IC is designed based on the logic circuits.

In operation S50, a library of the semiconductor IC is designed based on the layout. According to example embodiments of inventive concepts, designing the library may include creating a marking layer for the semiconductor device that indicates a semiconductor device of which a width is to be changed, based on a change in characteristics of the semiconductor device, and applying the created marking layer to the previously created existing layout, thereby creating a new library.

Optical proximity correction (OPC) may be performed based on the library designed using the above-described semiconductor IC design method to form a photomask. An exposure process may then be performed to form a wafer pattern according to the designed library on a wafer, thereby implementing a semiconductor IC.

According to example embodiments of inventive concepts, OPC may be performed based on the new library of a semiconductor device with a different width that was determined based on a change in characteristics of the semiconductor device, thereby implanting a semiconductor IC, including the semiconductor device having the changed width. According to example embodiments of inventive concepts, despite changing a characteristic in the semiconductor device, the time and cost consumption in designing the semiconductor integrated circuit may be significantly reduced because of the use of the previously created existing layout.

The above-described semiconductor IC design method may be represented as processes executable using a semiconductor IC design program executable on a computer, and thus, may be implemented by executing the semiconductor IC design program on a computer. Thus, in example embodiments of inventive concepts, the semiconductor IC design method may also be embodied as computer-readable codes on a computer-readable recording medium.

The computer-readable recording medium is any tangible data storage device that can store data which can be thereafter read by a computer system. Examples of the tangible computer-readable recording medium are read-only memory (ROM), random-access memory (RAM), CD-ROMs, magnetic tapes, floppy disks, optical data storage devices, and the like. The computer-readable recording medium can also be distributed over network-coupled computer systems so that the computer-readable code is stored and executed in a distributed fashion.

Figure 3:
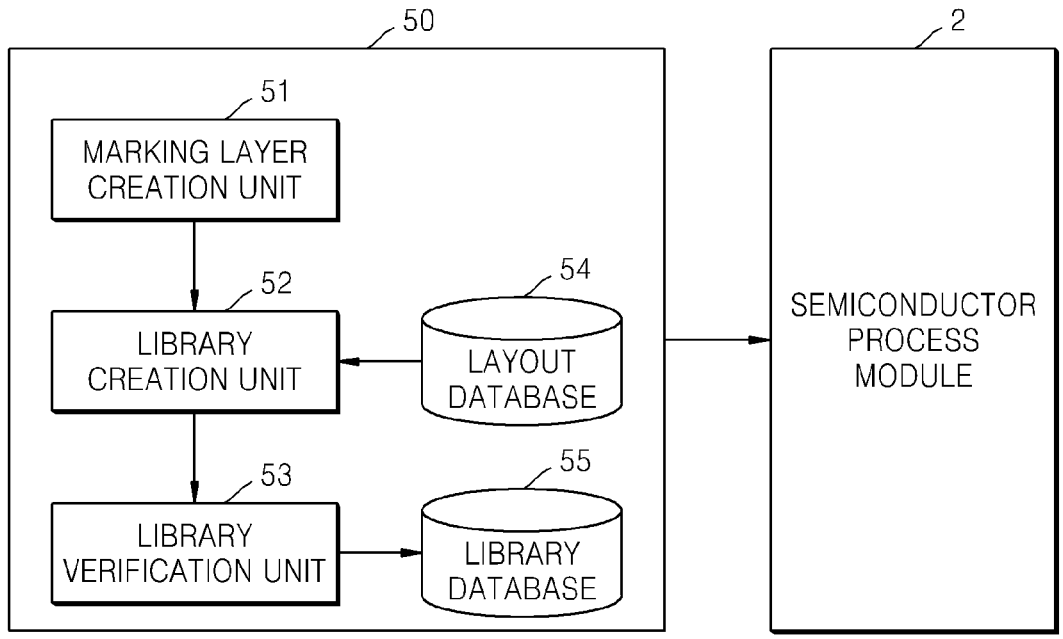
FIG. 3 is a block diagram of a library design unit of FIG. 1, according to example embodiments of inventive concepts.

FIG. 3 is a block diagram of the library design unit 50 of FIG. 1, according to example embodiments of inventive concepts.

Referring to FIG. 3, the library design unit 50 may include a marking layer creation unit 51, a library creation unit 52, a library verification unit 53, a layout database (DB) 54, and a library database (DB) 55. The library designed by the library design unit 50 may be transferred to the semiconductor process module 2, in which a semiconductor IC may be implemented based on the library.

The marking layer creation unit 51 may create a marking layer that indicates at least one of a plurality of semiconductor devices of which a width is to be changed based on a change in characteristics of the semiconductor device. According to example embodiments of inventive concepts, when characteristics of a semiconductor device are changed, a new library of the semiconductor device of which a width is to be changed may be created. To this end, a marking layer indicating the semiconductor device of which a width is to be changed may be created. According to example embodiments of inventive concepts, the marking layer may also be referred as an annotation layer. In particular, According to example embodiments of inventive concepts, the marking layer creation unit 51 may create a first marking layer (not shown) indicating at least one semiconductor device of which a width is to be changed. Additionally, according to example embodiments, the marking layer creation unit 51 may create a second marking layer (not shown) indicating a cell including the at least one semiconductor device. The second marking layer may mark a cell boundary. According to example embodiments, the marking layer creation unit 51 may create a second marking layer indicating the at least one semiconductor device and a second marking layer indicating a cell including the at least one semiconductor device, as is described below with reference to FIGS. 24 to 26.

A change in characteristics of the semiconductor device may be a change in electrical characteristics or thermal characteristics, and at least one of a height and a width of the semiconductor device, and a space between the semiconductor device and an adjacent semiconductor device may be changed according to the change in characteristics of the semiconductor device. As a semiconductor device is scaled down to, for example, to about 20 nm or less grade, manufacturing the semiconductor device on which the characteristic change is reflected via a process, for example, via implantation, may be more difficult. Therefore, there is a demand for changing at least one of the height, width, and space of a semiconductor device based on the characteristic change of the semiconductor device and creating a marking layer indicating this change. Hereinafter, changing the width of the semiconductor device due to the variation in at least one of the height, width and space of the semiconductor device, will be described in greater detail.

When a semiconductor device has an increased thickness, for example, due to an improved semiconductor process, a marking layer indicating the semiconductor device of which a width is to be adaptively changed may be created. The height of a semiconductor device as three-dimensional information is not represented in a layout, and thus, there is a demand to create a new library in which the height change of the semiconductor device is adaptively reflected to a width thereof. However, example embodiments of inventive concepts are not limited thereto, and may be applied in reducing the height of a semiconductor device.

For example, with the assumption that a semiconductor device is a fin field-effect transistor (FET) having a height of about 40 nm and a width of about 20 nm, if the height of the fin FET is increased to about 50 nm, the width of the fin FET may be adaptively reduced, for example, to about 18 nm, about 16 nm, or about 14 nm. As described above, if the height of a semiconductor device is changed, there is a demand for a new library of semiconductor devices. In this regard, a marking layer indicating a semiconductor device of which a width is to be changed may be created.

If the width or space of a semiconductor device is changed, for example, is increased, a marking layer indicating a semiconductor device of which a space from an adjacent semiconductor device or width is to be adaptively changed may be created. However, example embodiments of inventive concepts are not limited to the above, and may apply when the width or space of a semiconductor device is reduced.

According to example embodiments of inventive concepts, when a plurality of semiconductor devices are disposed with a constant pitch, even with a change in width of a semiconductor device, the pitch may be maintained constant if the space between the semiconductor devices is adaptively changed. Thus, a new library for changing the design of a semiconductor device without violation against a design rule may be created. When a plurality of semiconductor devices are disposed with a constant pitch, even with a change in space of a semiconductor device, the pitch may be maintained constant if the widths of the semiconductor devices are adaptively changed. Thus, a new library for changing the design of a semiconductor device without violation against a design rule may be created.

For example, with the assumption that a semiconductor device has a width of about 20 nm, a space of about 40 nm, and a pitch of about 60 nm. If the width of the semiconductor device is changed to about 18 nm, about 16 nm, or about 14 nm, the space may be adaptively changed to about 42 nm, about 44 nm, or about 46 nm with a constant pitch. As described above, if the width or space of a semiconductor device is changed, there is a demand for a new library of semiconductor devices. In this regard, a marking layer indicating a semiconductor device of which a width is to be changed may be created.

In another embodiment, when a plurality of semiconductor devices are disposed without a constant pitch, if the space between the semiconductor devices is relatively wide enough not to be constrained by the width of the semiconductor device, even with a change in width of a space of the semiconductor device, a new library for changing the design of a semiconductor device without violation against a design rule may be created.

The library creation unit 52 may create a new library of the semiconductor device with a changed width by applying the marking layer created by the marking layer creation unit 51 to the previously created existing layout. The previously created existing layout may be one of a plurality of layouts stored in the layout DB 54. As described above, According to example embodiments of inventive concepts, instead of using a new layout designed based on a characteristic change of the semiconductor device in manufacturing a semiconductor IC, a new library created by applying a marking layer to the previously created existing layout may be used. Therefore, since designing a new layout is unnecessary, the time and costs for designing a semiconductor IC may be significantly reduced.

The library verification unit 53 may verify if the new library created by the library creation unit 52 satisfies a desired (or alternatively preset) requirement. In particular, the library verification unit 53 may characterize the created new library. For example, characterization by the library verification unit 53 may be performed by reflecting the changed width in the new library to netlist extraction. The characterization may include extraction of timing information such as a delay in signal transmission between ports, a set up/hold time, or a pulse width, a parameter such as power consumption, number of transistors, cell height or width, or terminal capacitance, and technology-dependent information values such as pin capacitance.

The layout DB 54 may store the layout designed by the layout design unit 40 of FIG. 1, and the library DB 55 may store the library provided from the library verification unit 53. The library DB 55 may store a variety of cell libraries, at least one of which may be provided according to a user's demand.

The cell library selected according to the user's demand may be provided to the semiconductor process module 2, in which a process such as OPC may be performed to form a photomask, which may be then used in an exposure process to form a wafer pattern according to the selected cell library on a wafer, thereby implementing a semiconductor IC.

According to example embodiments of inventive concepts, even with a characteristic change in a semiconductor device, without designing a new layout for the semiconductor device, a new library of the semiconductor device may be created using a previously created existing layout. The new library may be provided to the semiconductor process module 2, and may then be used through comparison with the previously created existing layout in manufacturing a semiconductor IC including the semiconductor device with a changed width.

Figure 4:
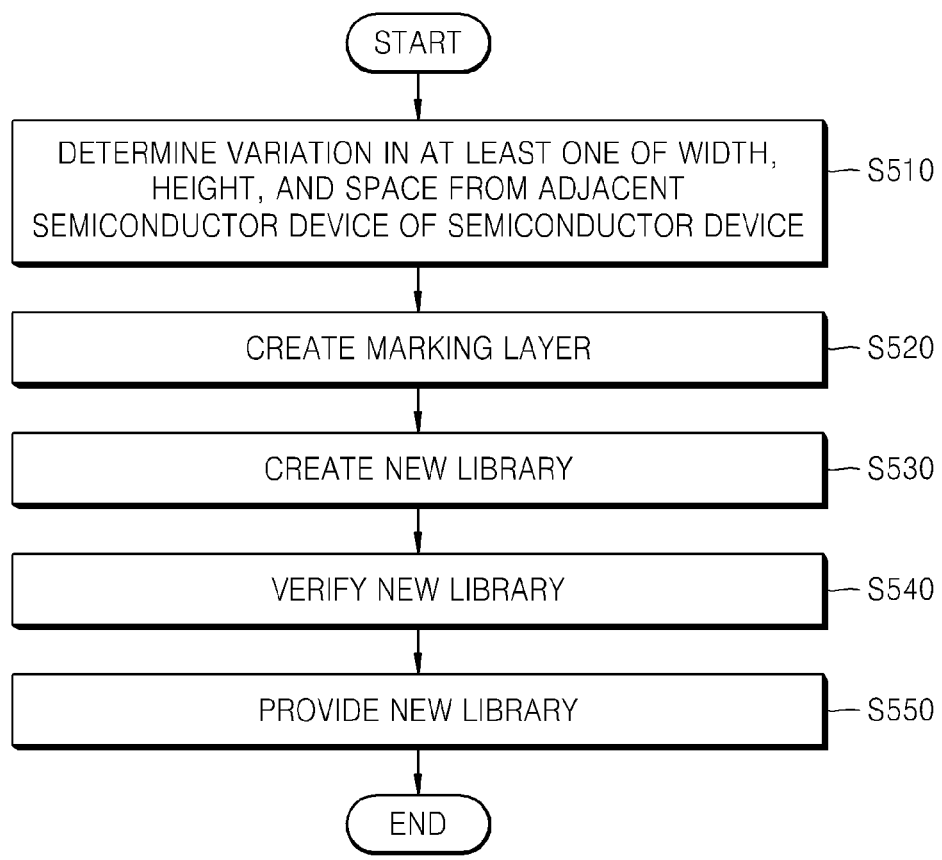
FIG. 4 is a flowchart of a library design operation in the semiconductor IC design method of FIG. 2, according to example embodiments of inventive concepts.

FIG. 4 is a flowchart of the library design operation S50 in the semiconductor IC design method of FIG. 2, according to example embodiments of inventive concepts.

Referring to FIG. 4, the library design operation may include sequential operations performed by the library design unit 50 of FIG. 3. A detailed description of the library design unit 50, which is provided above, applies to the library design operation described with reference to FIG. 4.

In operation S510, a variation in at least one among width, height, and space from an adjacent semiconductor device of a least one of a plurality of semiconductor devices is determined. In particular, the variation in width, height, or space of the at least one semiconductor device may be determined based on at least one of a design rule and design restrictions. Operation S510 may be performed prior to the library design operation S50 of FIG. 2.

In operation S520, a marking layer indicating the at least one semiconductor device of which a width is to be changed is created based on the determined variation.

In operation S530, the created marking layer is applied to the previously created existing layout to create a new library.

In operation S540, whether the new library satisfies a desired (or alternatively preset) requirement is verified.

In operation S550, the verified new library is provided to a customer who wants the new library.

The above-described library design method may be represented as processes executable using a semiconductor IC design program executable on a computer, and thus, may be implemented by executing the library design program on a computer. Thus, in example embodiments of inventive concepts, the library design method may also be embodied as computer-readable codes on a tangible computer-readable recording medium.

The tangible computer-readable recording medium may be any tangible data storage device that can store data which can be thereafter read by a computer system. Examples of the computer-readable recording medium are ROM, RAM, CD-ROMs, magnetic tapes, floppy disks, optical data storage devices, and the like. The tangible computer-readable recording medium can also be distributed over network-coupled computer systems so that the computer-readable code is stored and executed in a distributed fashion.

Figure 5:
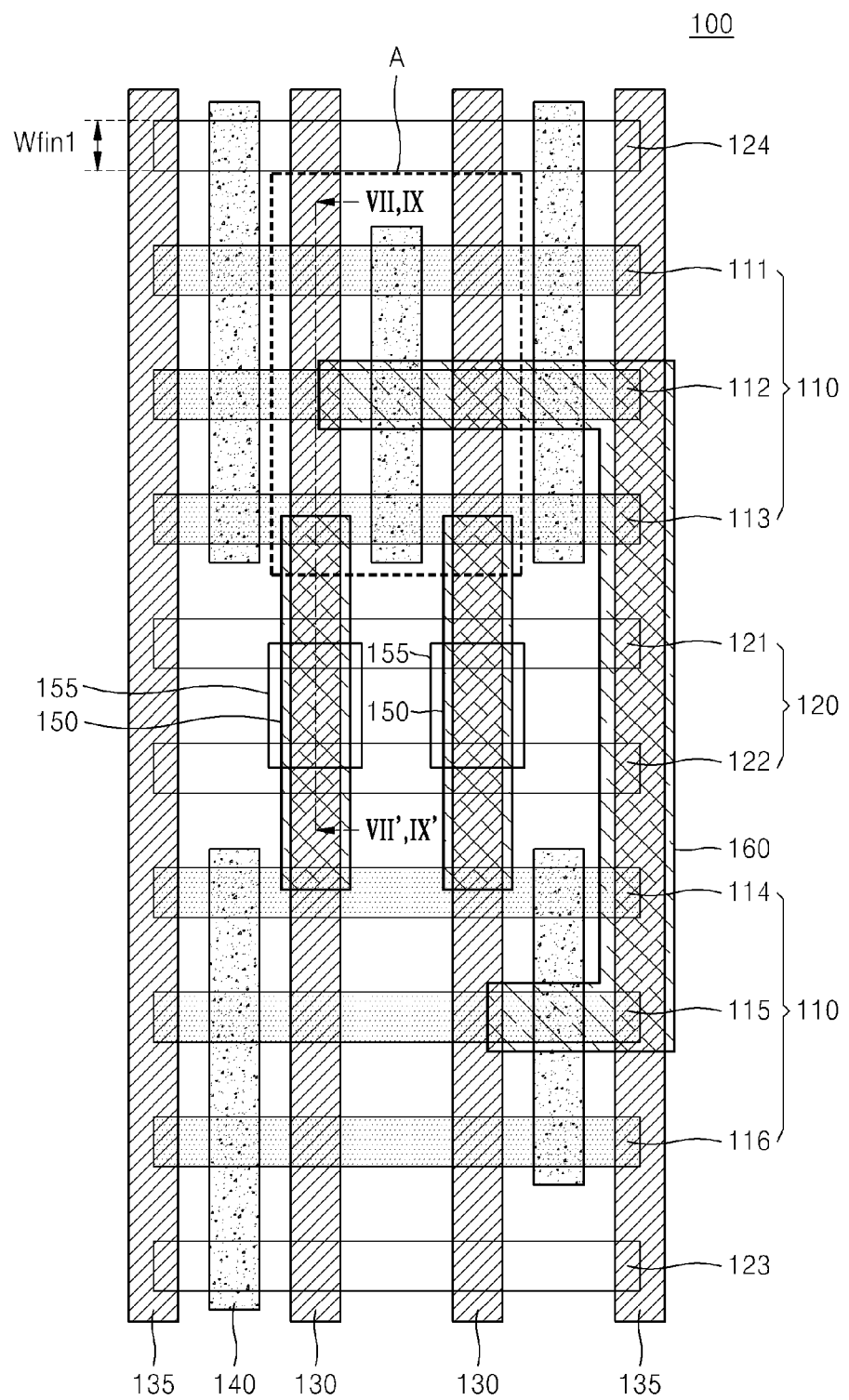
FIG. 5 is a layout of a semiconductor IC according to example embodiments of inventive concepts.

FIG. 5 is a layout of a semiconductor IC 100 according to example embodiments of inventive concepts. In particular, FIG. 5 mainly illustrates an example of a standard cell of the semiconductor IC 100.

Referring to FIG. 5, the semiconductor IC 100 may include a plurality of active fins 110, a plurality of dummy fins 120, a plurality of gate electrodes 130, a plurality of dummy gate electrodes 135, a plurality of source/drain contacts 140, two input terminals 150, two source/drain contacts 155, and an output terminal 160. The plurality of active fins 110 may include first to sixth active fins 111 to 116, and the plurality of dummy fins 120 may include first to fourth dummy fins 121 to 124. According to example embodiments of inventive concepts, the semiconductor IC 100 may be an NAND gate cell.

Firstly, a plurality of fins, including the plurality of active fins 110 and the plurality of dummy fins 120, may be previously formed on a semiconductor substrate (not shown) through a single process. Subsequently, a plurality of gate electrodes, including the plurality of gate electrodes 130 and the plurality of dummy gate electrodes 135, and the plurality of source/drain contacts 140 may be formed. Next, the two input terminals 150 and the output terminal 160 may be formed.

The plurality of active fins 110 arranged adjacent to one another may constitute one fin FET. A channel width of the fin FET may be increased in proportional to the number of active fins constituting the fin FET, and thus, a current amount flowing through the fin FET may be increased. The channel width of the fin FET is described below in greater detail.

The first to third active fins 111, 112, and 113 may constitute a PMOS transistor, and the fourth to sixth active fins 114, 115, and 116 may constitute an NMOS transistor. In particular, the two gate electrodes 130 and the three source/drain contacts 140 are arranged above the first to third active fins 111, 112, and 113, so that the first to third active fins 111, 112 and 113 may constitute two PMOS transistors connected to each other in parallel. The two gate electrodes 130 and the three source/drain contacts 140 are arranged above the fourth to sixth active fins 114, 115, and 116, so that the fourth to sixth active fins 114, 115 and 113 may constitute two NMOS transistors connected to each other in parallel. However, example embodiments of inventive concepts are not limited thereto.

The entire surface of a protruding fin of the fin FET may serve as a channel so that a sufficient channel length may be ensured. This may reduce (and/or prevent) a short channel effect, thereby improving problems of leakage current and a small area caused from the short channel effect in existing MOS transistors.

According to example embodiments of inventive concepts, the semiconductor IC 100 may be designed using the above-described semiconductor IC design method. In particular, the semiconductor IC 100 may be designed using the above-described library design method, according to the new library of the semiconductor device with a changed width. According to example embodiments of inventive concepts, the new library may be created by creating a marking layer for the semiconductor device that indicates a semiconductor device of which a width is to be changed, based on a change in characteristics of the semiconductor device, and applying the created marking layer to the previously created existing layout. Hereinafter, example embodiments of inventive concepts related to designing the semiconductor IC 100 based on the new library will be described with reference to FIGS. 6 to 12.

Figure 6:
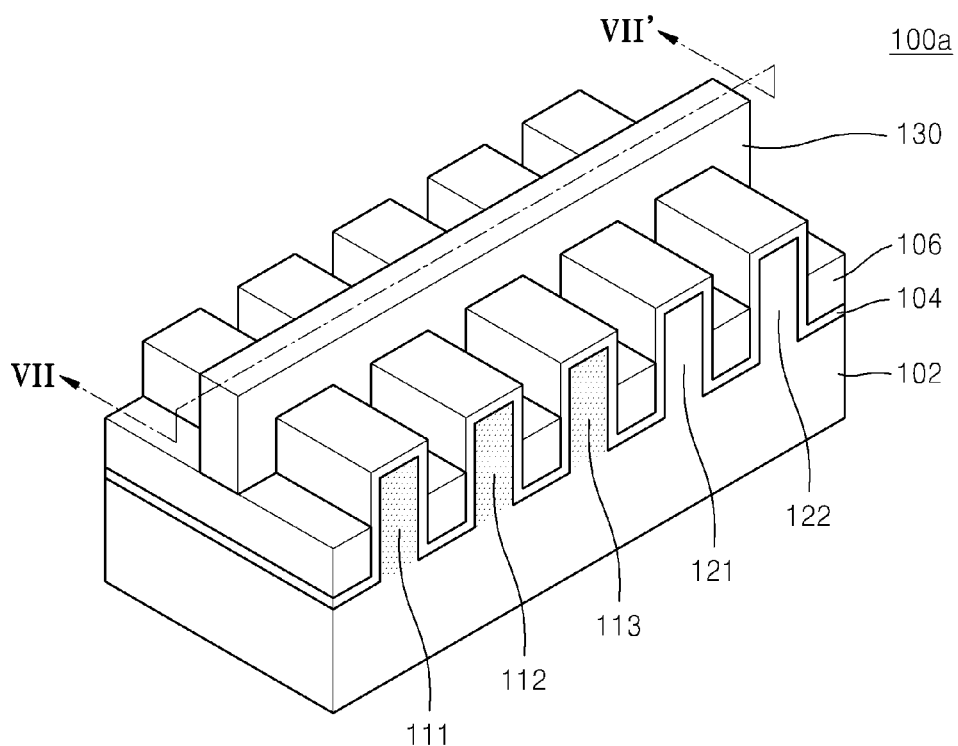
FIG. 6 is a perspective view of a semiconductor device with the layout of FIG. 5, according to example embodiments of inventive concepts.

FIG. 6 is a perspective view of a semiconductor device 100a having the layout of FIG. 5, according to example embodiments of inventive concepts.

Figure 7:
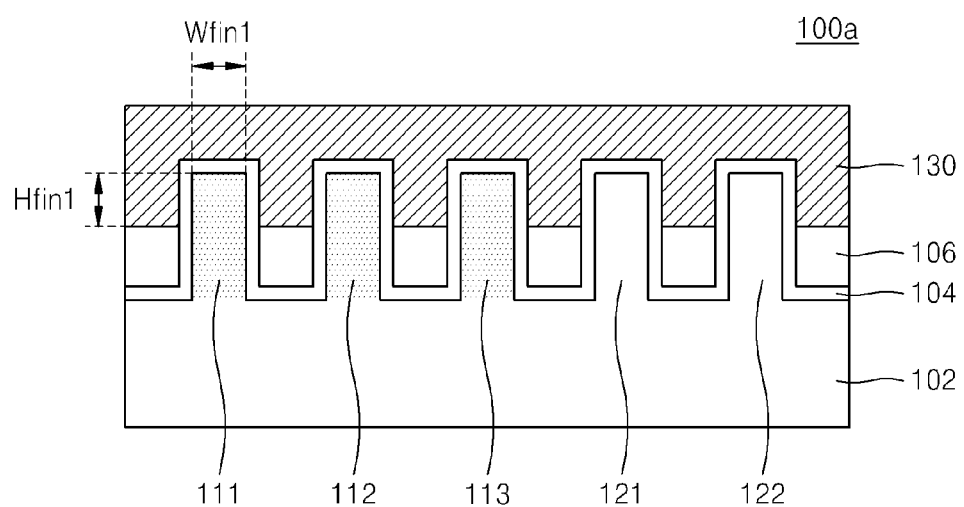
FIG. 7 is a cross-sectional view taken along line VII-VII' of FIGS. 5 and 6.

FIG. 7 is a cross-sectional view taken along line VII-VII' of FIGS. 5 and 6.

Referring to FIGS. 6 and 7, the semiconductor device 100a may be a bulk type fin FET. The semiconductor device 100a may include a substrate 102, a first insulating layer 104, a second insulating layer 106, a plurality of active fins 111, 112, and 113, a plurality of dummy fins 121 and 122, and a gate electrode 130.

The substrate 102 may be a semiconductor substrate. For example, the substrate 102 may include at least one of silicon, silicon-on-insulator (SOI), silicon-on-sapphire (SOS), germanium, silicon-germanium, and gallium-arsenide.

The plurality of active fins 111, 112, and 113, and the plurality of dummy fins 121 and 122 may be arranged to be connected to the substrate 102. According to example embodiments of inventive concepts, protruding portions of the plurality of active fins 111, 112, and 113 that are perpendicular with respect to the substrate 102 may be n+ or p+ doped active regions, and protruding portions of the plurality of dummy fins 121 and 122 that are perpendicular with respect to the substrate 102 may be undoped regions. Alternatively, according to example embodiments inventive concepts, the plurality of active fins 111, 112, and 113 and the plurality of dummy fins 121 and 122 may all be n+ or p+ doped active regions.

The plurality of active fins 111, 112, and 113 may each have a first width Wfin1 and a first height Hfin1, and thus, may each have a channel width of (Hfin1*2+Wfin1). The first height Hfin1 indicates a height from an upper surface of the second insulating layer 106 to an upper surface of each of the active fins 111, 112, and 113. When N number of active fins constitute one fin FET, the fin FET may have a channel width of (Hfin1*2+Wfin1)*N. According to example embodiments of inventive concepts, the first to third active fins 111, 112, and 113 may constitute one fin FET, and the fin FET may have a channel width of (Hfin1*2+Wfin1)*3.

The first and second insulating layers 104 and 106 may include an insulating material, for example, which may include one of an oxide layer, a nitride layer, and an oxynitride layer. The first insulating layer 104 may be disposed on the plurality of active fins 111, 112, and 113 and the plurality of dummy fins 121 and 122. The first insulating layer 104 may be disposed between the plurality of active fins 111, 112, and 113, and the gate electrode 130, and thus, may serve as a gate insulating layer. The second insulating layer 106 may be disposed in a space between the plurality of active fins 111, 112, and 113, and the plurality of dummy fins 121 and 122 to have a predetermined height. The second insulating layer 106 may be disposed among the plurality of active fins 111, 112, and 113, and the plurality of dummy fins 121 and 122, and thus, may be used as a device isolation layer.

The gate electrode 130 may be arranged on the first and second insulating layers 104 and 106 to have a structure surrounding the plurality of active fins 111, 112, and 113 and the plurality of dummy fins 121 and 122, i.e., a structure including the plurality of active fins 111, 112, and 113, and the plurality of dummy fins 121 and 122 in the gate electrode 130. The gate electrode 130 may include at least one of a metallic material such as tungsten (W) and tantalum (Ta), a nitride thereof, a silicide thereof, and a doped polysilicon, and may be formed using a deposition process.

Figure 8:
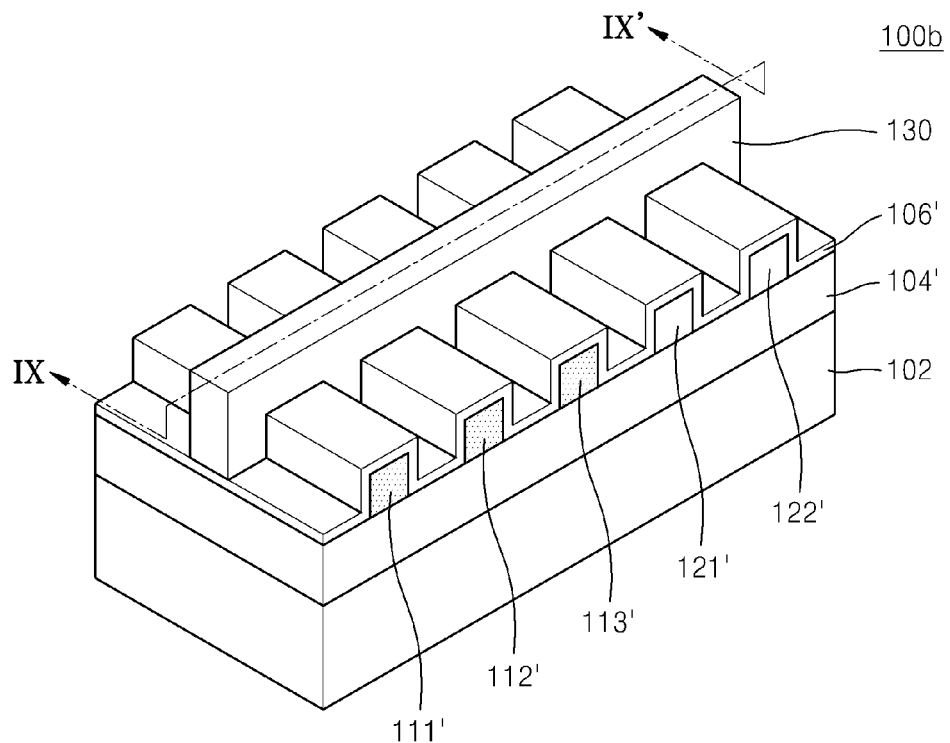
FIG. 8 is a perspective view of a semiconductor device with the layout of FIG. 5, according to example embodiments of inventive concepts.

FIG. 8 is a perspective view of a semiconductor device 200b having the layout of FIG. 5, according to example embodiments of inventive concepts.

Figure 9:
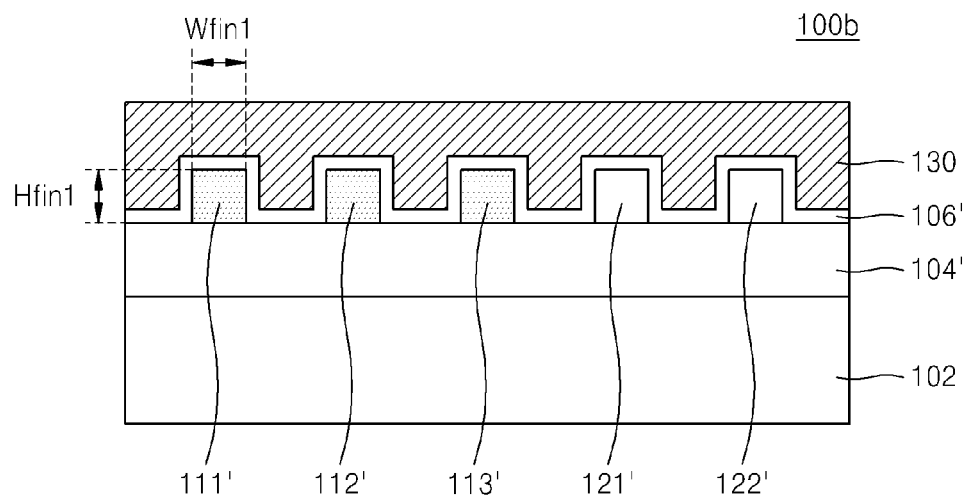
FIG. 9 is a cross-sectional view taken along line IX-IX' of FIGS. 5 and 8.

FIG. 9 is a cross-sectional view taken along line IX-IX' of FIGS. 5 and 8.

Referring to FIGS. 8 and 9, the semiconductor device 100b may be an SOI type fin FET. The semiconductor device 100b may include a substrate 102, a first insulating layer 104', a second insulating layer 106', a plurality of active fins 111', 112', and 113', a plurality of dummy fins 121' and 122', and a gate electrode 130. The semiconductor device 100b according to example embodiments of inventive concepts is a modified example of the semiconductor device 100a of FIGS. 6 and 7 according to example embodiments of inventive concepts, and thus, the semiconductor device 100b will be described focusing on a difference from the semiconductor device 100a, and a repeated detailed description thereof is not provided.

The first insulating layer 104' may be arranged on the substrate 102. The second insulating layer 106' may be disposed between the plurality of active fins 111', 112', and 113', and the gate electrode 130, and thus, may serve as a gate insulating layer.

The plurality of active fins 111', 112', and 113', and the plurality of dummy fins 121' and 122' may include a semiconductor material, for example, silicon or doped silicon. The plurality of active fins 111', 112', and 113' may each have a first width Wfin1 and a first height Hfin1, and thus, may each have a channel width of (Hfin1*2+Wfin1). The first height Hfin1 indicates a height from an upper surface of the first insulating layer 104' to an upper surface of each of the active fins 111', 112', and 113'. When N number of active fins constitute one fin FET, the fin FET may have a channel width of (Hfin1*2+Wfin1)*N. According to example embodiments of inventive concepts, the first to third active fins 111', 112', and 113' constitute one fin FET, the fin FET may have a channel width of (Hfin1*2+Wfin1)*3.

The gate electrode 130 may be arranged on the second insulating layer 106' to have a structure surrounding the plurality of active fins 111', 112', and 113', the plurality of dummy fins 121' and 122', and the second insulating layer 106', i.e., a structure including the plurality of active fins 111', 112', and 113', and the plurality of dummy fins 121' and 122' in the gate electrode 130.

Figure 10:
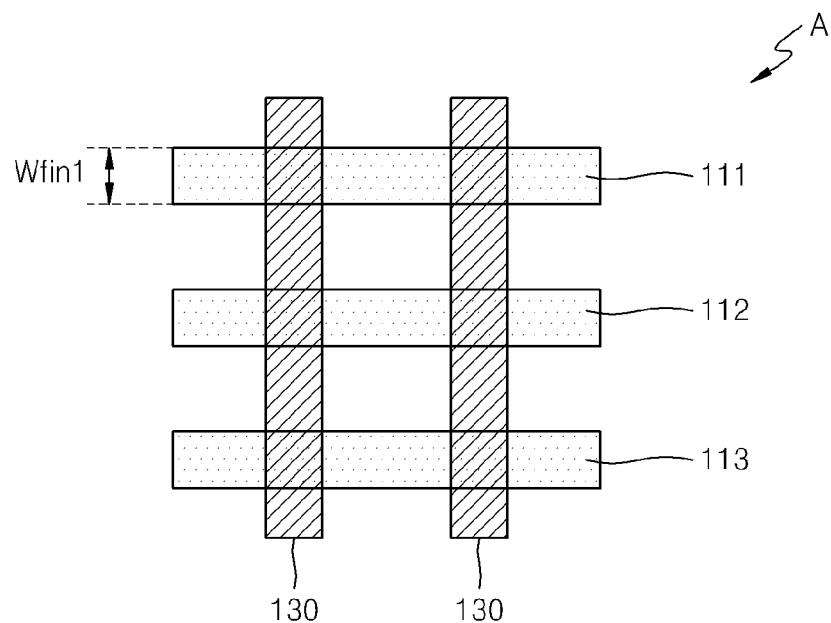
FIG. 10 is a layout of a region A in FIG. 5.

FIG. 10 is a layout of a region A in FIG. 5.

Referring to FIG. 10, the region A includes the first to third active fins 111, 112, and 113, and the gate electrodes 130. For convenience of illustration, the source/drain contact 140, the two input terminals 150, and the output terminal 160 in the region A of FIG. 5 are excluded in FIG. 10. In FIG. 10, which is a two-dimensional layout, the height information of the first to third active fins 111, 112, and 113 is not presented.

In a semiconductor IC design method according to example embodiments of inventive concepts, when the first to third active fins 111, 112, and 113 are determined to each have a width increased by about 10%, a marking layer indicating the first to third active fins 111, 112, and 113 may be created, and then be applied to the previously created existing layout, thereby creating a new library of the semiconductor device with a changed channel width.

Figure 11:
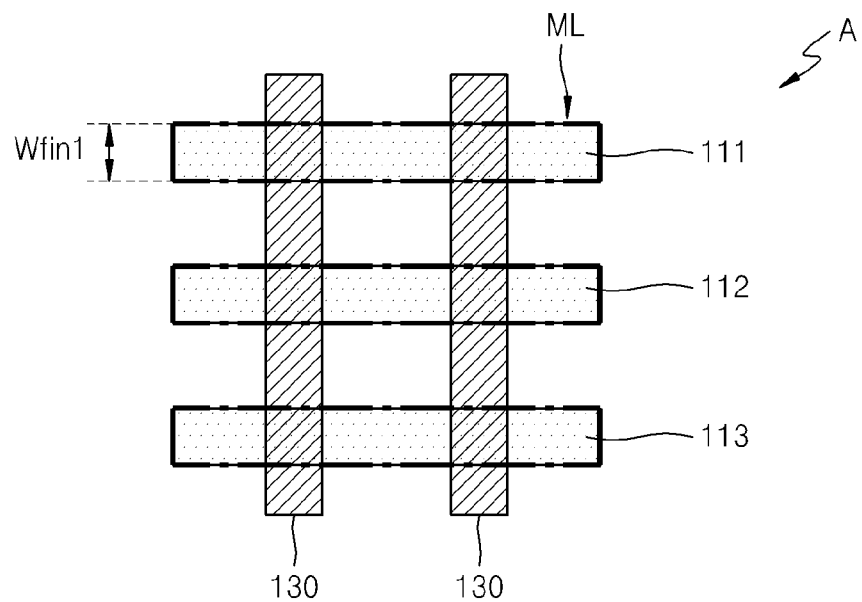
FIG. 11 illustrates a marking layer applied to the layout of FIG. 10, according to example embodiments of inventive concepts.

FIG. 11 illustrates a marking layer ML applied to the layout of FIG. 10, according to example embodiments of inventive concepts.

Referring to FIG. 11, when the first to third active fins 111, 112, and 113 are determined to have a width increased by about 10%, the marking layer ML indicating the first to third active fins 111, 112, and 113 may be created. The marking layer ML may be created to correspond to each of the first to third active fins 111, 112, and 113. According to example embodiments of inventive concepts, the marking layer ML may also be referred as an annotation layer.

For example, with the assumption that the first width Wfin1 is about 10 nm, and the first height Hfin1 is about 20 nm, the first to third active fins 111, 112, and 113 may each have a channel width of about 10 nm (=20*2+10), and the fin FET may have a channel width of about 150 nm (=50*3). When the first to third active fins 111, 112, and 113 each have a channel width increased by about 10%, the channel width of each of the first to third active fins 111, 112, and 113 needs to be increased by about 5 nm.

To this end, instead of designing a new layout, the marking layer ML indicating the first to third active fins 111, 112, and 113 of which channel widths are to be changed may be created as illustrated in FIG. 11. According to example embodiments of inventive concepts, the marking layer ML may be created to correspond to each of the first to third active fins 111, 112, and 113. Although not illustrated, according to example embodiments of inventive concepts, a marking layer ML indicating a cell including the first to third active fins 111, 112, and 113 may be created.

Figure 12:
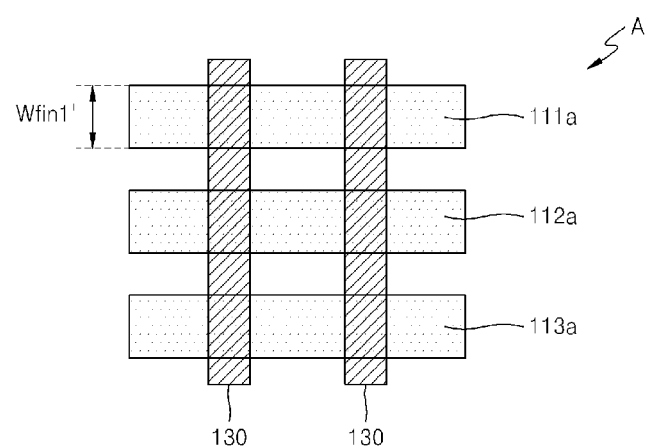
FIG. 12 is a layout of a semiconductor device of which a width is changed based on a new library created using the marking layer of FIG. 11, according to example embodiments of inventive concepts.

FIG. 12 is a layout of a semiconductor device of which a width is changed based on a new library created using the marking layer of FIG. 11, according to example embodiments of inventive concepts.

Referring to FIG. 12, a new library of new first to third active fins 111a, 112a, and 113a, each of which a channel width is increased by about 10%, may be created by applying the marking layer ML of FIG. 11 to a previously created existing layout. As a result, the first to third new active fins 111a, 112a, and 113a may each have a new first width Wfin1'. For example, the new first width Wfin1' may be about 15 nm, and a new fin FET, including the new first to third active fins 111a, 112a, 113a, may have a channel width of about 165 nm.

According to example embodiments of inventive concepts, even with a characteristic change in a semiconductor device, without designing a new layout for the semiconductor device, a new library of the semiconductor device may be created by applying a marking layer to a previously created existing layout and provided to a user. The user may perform a process such as OPC based on the new library to form a photomask, which may be then used in an exposure process to form a wafer pattern according to the new library on a wafer, thereby implementing a semiconductor IC as illustrated in FIG. 12.

While FIGS. 5-11 illustrate a case where a marking layer ML is applied to a layout of a semiconductor IC having rectangular shaped fins 111-113 in order to indicate a change in a width of the rectangular shaped fins 111-113, and FIG. 12 illustrates a layout of a semiconductor device of which a width is changed based on a new library created using the marking layer ML of FIG. 11, example embodiments of inventive concepts are not limited thereto.

For example, according to example embodiments of inventive concepts, a layout of a semiconductor IC may be similar to semiconductor devices 100a and 100b shown in FIGS. 6-9, except the active fins (111-113, 111'-113') and/or dummy fins (121-122, 121'-121') may have rounded tops instead of rectangular tops, and the insulating layers 104 or 106' in FIGS. 6-9 may conformally cover the rounded tops of the active fins and/or dummy fins. A non-limiting example of a fin structure with a rounded top portion is illustrated in FIG. 3 of KR 10-2008-0073392, which is incorporated by reference herein.

Additionally, in the case where the active fins and/or dummy fins have rounded top portions, the marking layer ML applied in FIG. 11 may instead be utilized to indicate a change in the radius of the rounded top portion of the active fins and/or dummy fins. Additionally, similar to FIG. 12, a layout of a semiconductor device may be generated where a radius of a rounded top portion in the active fins and/or dummy fins is changed based on a new library created using a marking layer.

Figure 13:
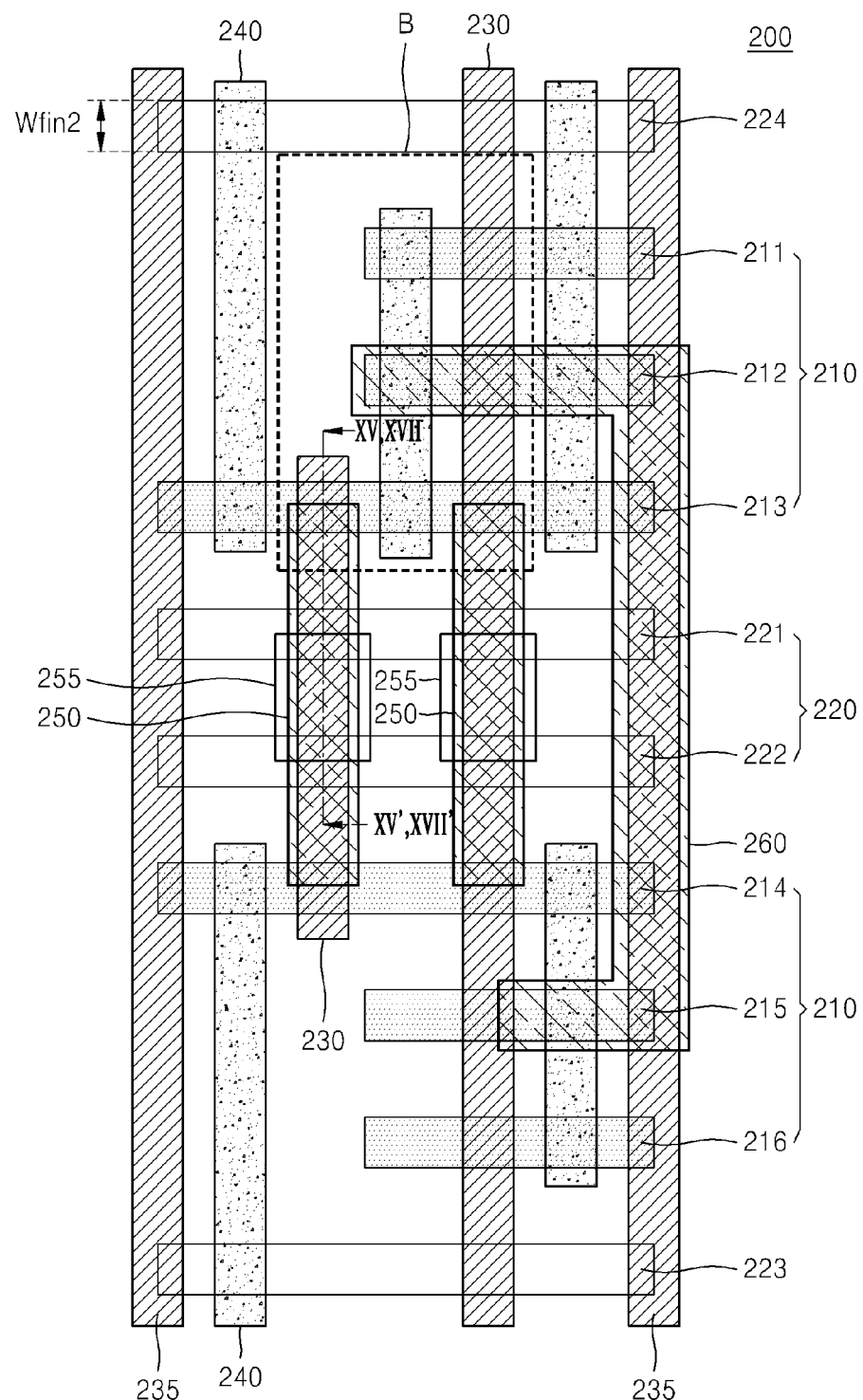
FIG. 13 is a layout of a semiconductor IC according to example embodiments of inventive concepts.

FIG. 13 is a layout of a semiconductor IC 200 according to example embodiments of inventive concepts. In particular, an example of a standard cell of the semiconductor IC 200 is mainly shown.

Referring to FIG. 13, the semiconductor IC 200 may include a plurality of active fins 210, a plurality of dummy fins 220, a plurality of gate electrodes 230, a plurality of dummy gate electrodes 235, a plurality of source/drain contacts 240, two input terminals 250, two source/drain contacts 255, and an output terminal 260. The plurality of active fins 210 may include first to sixth active fins 211 to 216, and the plurality of dummy fins 220 may include first to fourth dummy fins 221 to 224.

Firstly, a plurality of fins, including the plurality of active fins 210 and the plurality of dummy fins 220, may be previously formed on a semiconductor substrate (not shown) through a single process. Subsequently, a plurality of gate electrodes, including the plurality of gate electrodes 230 and the plurality of dummy gate electrodes 235, and the plurality of source/drain contacts 240, may be formed. Next, the two input terminals 250 and the output terminal 260 may be formed.

According to example embodiments of inventive concepts, one active fin 210 may constitute a single fin FET, or the plurality of active fins 210 may constitute one fin FET. Thus, the plurality of active fins 210 arranged adjacent to one another may each constitute a different fin FET. In the present embodiments, the first to third active fins 211, 212, and 213 may constitute a PMOS transistor, and the fourth to sixth active fins 214, 215, and 216 may constitute an NMOS transistor. The third and fourth active fins 213 and 214 may each constitute a single fin transistor. However, the inventive concept is not limited thereto.

According to example embodiments of inventive concepts, the semiconductor IC 200 may be designed using the above-described semiconductor IC design method. In particular, the semiconductor IC 200 may be designed using the above-described library design method, according to the new library of the semiconductor device with a changed width. According to example embodiments of inventive concepts, the new library may be created by creating a marking layer for the semiconductor device that indicates a semiconductor device of which a width is to be changed, based on a change in characteristics of the semiconductor device, and applying the created marking layer to the previously created existing layout. Hereinafter, embodiments of designing the semiconductor IC 200 based on the new library will be described with reference to FIGS. 14 to 20.

Figure 14:
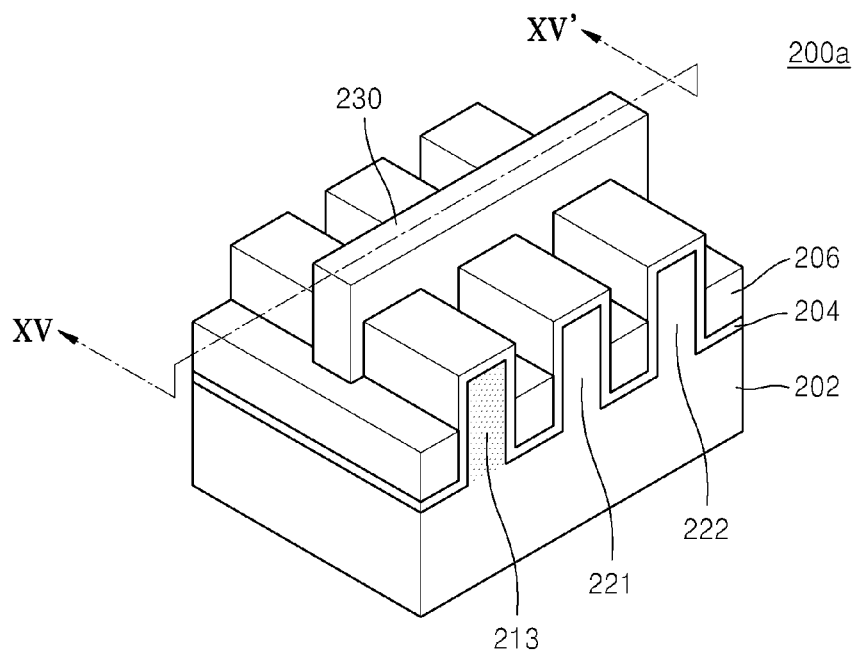
FIG. 14 is a perspective view of a semiconductor device with the layout of FIG. 13, according to example embodiments of inventive concepts.

FIG. 14 is a perspective view of a semiconductor device 200a having the layout of FIG. 13, according to example embodiments of inventive concepts.

Figure 15:
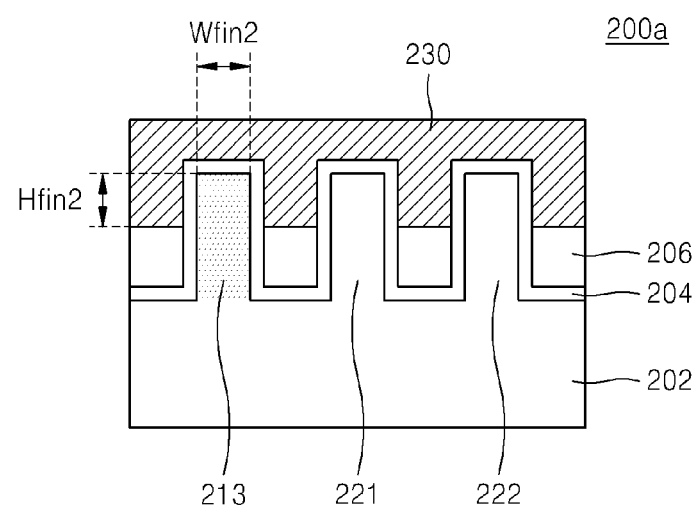
FIG. 15 is a cross-sectional view taken along line XV-XV' of FIGS. 13 and 14.

FIG. 15 is a cross-sectional view taken along line XV-XV' of FIGS. 13 and 14.

Referring to FIGS. 14 and 15, the semiconductor device 200a may be a bulk type fin FET. The semiconductor device 200a may include a substrate 202, a first insulating layer 204, a second insulating layer 206, a third active fin 213, a plurality of dummy fins 221 and 222, and a gate electrode 230. According to example embodiments of inventive concepts, one third active fin 213 of the semiconductor device 200a may constitute one fin FET.

The substrate 202 may be a semiconductor substrate, for example, including one of silicon, silicon-on-insulator (SOI), silicon-on-sapphire (SOS), germanium, silicon-germanium, and gallium-arsenide. However, example embodiments of inventive concepts are not limited thereto.

The third active fin 213 and the plurality of dummy fins 221 and 222 may be arranged to be connected to the substrate 202. According to example embodiments of inventive concepts, a protruding portion of the third active fin 213 that is perpendicular with respect to the substrate 202 may be an n+ or p+ doped active region, and protruding portions of the plurality of dummy fins 221 and 222 that are perpendicular with respect to the substrate 202 may be undoped regions. Alternatively, the third active fin 213 and the plurality of dummy fins 221 and 222 may all be n+ or p+ doped active regions.

The third active fin 213 may have a second width Wfin2 and a second height Hfin2, and thus, may each have a channel width of (Hfin2*2+Wfin2). The second height Hfin2 indicates a height from an upper surface of the second insulating layer 206 to an upper surface of the third active fin 213. According to example embodiments of inventive concepts, the third active fin 213 constitutes a single fin FET, and the fin FET may have a channel width of (Hfin2*2+Wfin2).

The first and second insulating layers 204 and 206 may include an insulating material, for example, which may include one of an oxide layer, a nitride layer, and an oxynitride layer. The first insulating layer 204 may be disposed on the third active fin 213, and the plurality of dummy fins 221 and 222. The first insulating layer 204 may be disposed between the third active fin 213 and the gate electrode 230, and thus, may serve as a gate insulating layer. The second insulating layer 206 may be disposed in a space between the third active fin 213, and the plurality of dummy fins 221 and 222 to have a predetermined height. The second insulating layer 206 may be disposed among the plurality of active fins 213, and the plurality of dummy fins 221 and 222, and thus, may be used as a device isolation layer.

The gate electrode 230 may be arranged on the third active fin and the first insulating layer 204 corresponding thereto to have a structure surrounding the third active fin 213, and the first insulating layer 204, i.e., a structure including the third active fin 213 in the gate electrode 230. The gate electrode 230 may include at least one of a metallic material such as tungsten (W) and tantalum (Ta), a nitride thereof, a silicide thereof, and a doped polysilicon, and may be formed using a deposition process.

Figure 16:
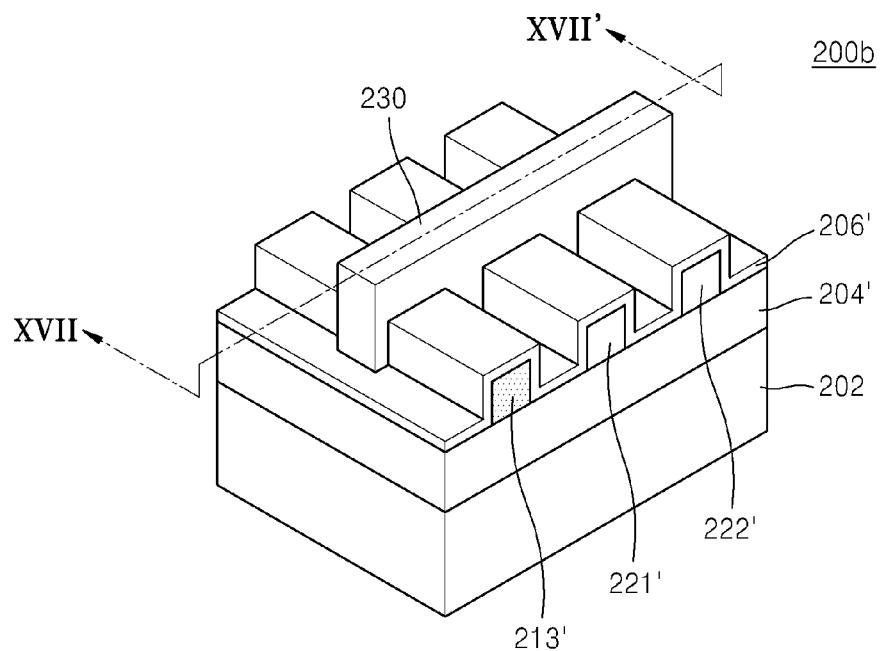
FIG. 16 is a perspective view of a semiconductor device with the layout of FIG. 13, according to example embodiments of inventive concepts.

FIG. 16 is a perspective view of a semiconductor device 200b having the layout of FIG. 13, according to example embodiments of inventive concepts.

Figure 17:
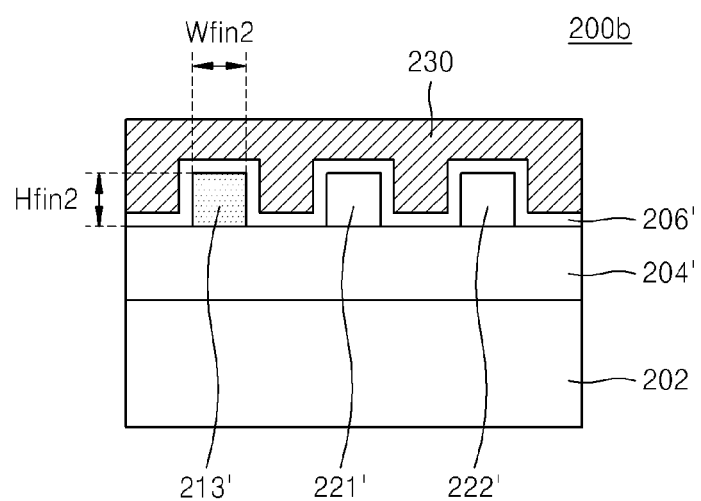
FIG. 17 is a cross-sectional view taken along line XVII-XVII' of FIGS. 13 and 16.

FIG. 17 is a cross-sectional view taken along line XVII-XVII' of FIGS. 13 and 16.

Referring to FIGS. 16 and 17, the semiconductor device 200b may be an SOI type fin FET. The semiconductor device 200b may include a substrate 202, a first insulating layer 204', a second insulating layer 206', a third active fin 213', and a plurality of dummy fins 211' and 212', and a gate electrode 230. The semiconductor device 200b in the present embodiment is a modified example of the semiconductor device 200a of FIGS. 14 and 15, and thus, the present embodiment will be described focusing on difference from the semiconductor device 200a, and a repeated detailed description thereof is omitted.

The second insulating layer 206' may be disposed between the third active fin 213', and the gate electrode 230, and thus, may serve as a gate insulating layer.

The third active fin 213' and the plurality of dummy fins 221' and 222' may include a semiconductor material, for example, silicon or doped silicon. The third active fin 213' may have a second width Wfin2 and a second height Hfin2, and thus, may have a channel width of (Hfin2*2+Wfin2). The second height Hfin2 indicates a height from an upper surface of the first insulating layer 204' to an upper surface of the third active fin 213'.

The gate electrode 230 may be arranged on the third active fin 213' and the second insulating layer 206 corresponding thereto to have a structure surrounding the third active fin 213' and the second insulating layer 206', i.e., a structure including the third active fin 213' in the gate electrode 230.

Figure 18:
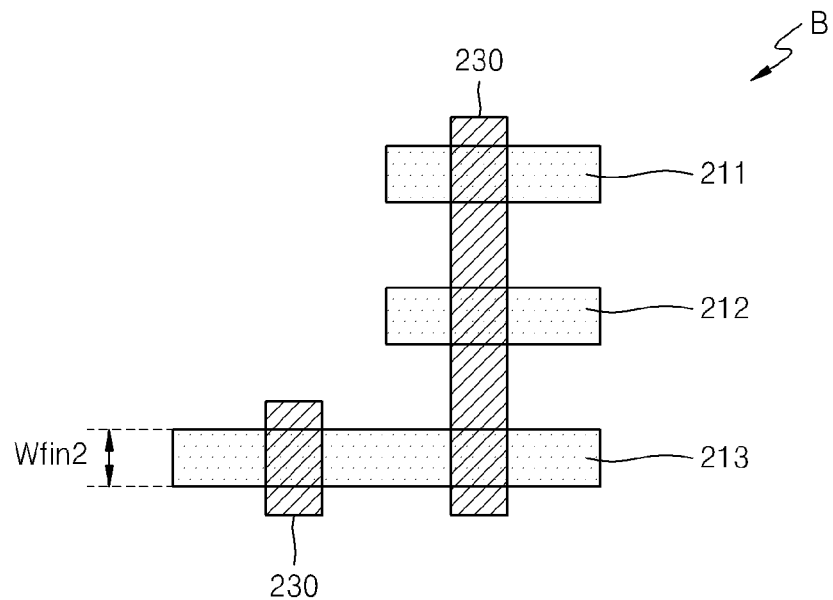
FIG. 18 is a layout of a region B in FIG. 13.

FIG. 18 is a layout of a region B in FIG. 13. Referring to FIG. 18, the region B includes the first to third active fins 211, 212, and 213, and a plurality of gate electrode 230. For convenience of illustration, the source/drain contact 240, the two input terminals 250, and the output terminal 260 in the region B of FIG. 13 are excluded in FIG. 18. In FIG. 18, which is a two-dimensional layout, the height information of the first to third active fins 211, 212, and 213 is not presented.

In a semiconductor IC design method according to example embodiments of inventive concepts, when the first to third active fins 211, 212, and 213 are determined to each have a width increased by about 10%, a marking layer indicating the first to third active fins 211, 212, and 213 may be created, and then be applied to the previously created existing layout, thereby creating a new library of the semiconductor device with a changed channel width.

Figure 19:
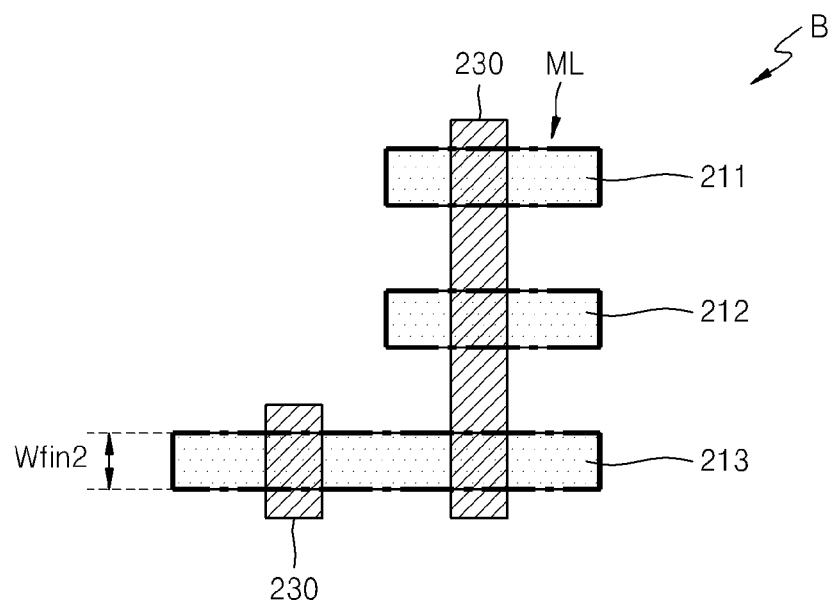
FIG. 19 illustrates a marking layer applied to the layout of FIG. 18, according to example embodiments of inventive concepts.

FIG. 19 illustrates a marking layer ML applied to the layout of FIG. 18, according to example embodiments of inventive concepts.

Referring to FIG. 19, when the first to third active fins 211, 212, and 213 are determined to have a width increased by about 10%, the marking layer ML indicating the first to third active fins 211, 212, and 213 may be created. The marking layer ML may be created to correspond to each of the first to third active fins 211, 212, and 213. According to example embodiments of inventive concepts, the marking layer ML may also be referred as an annotation layer.

For example, with the assumption that the second width Wfin2 is about 10 nm, and the second first height Hfin2 is about 20 nm, the first to third active fins 211, 212, and 213 may each have a channel width of about 50 nm (=20*2+10), and the fin FETs may each have a channel width of about 50 nm. When the first to third active fins 211, 212, and 213 each have a channel width increased by about 10%, the channel width of each of the first to third active fins 211, 212, and 213 needs to be increased by about 5 nm.

To this end, instead of designing a new layout, the marking layer ML, indicating the first to third active fins 211, 212, and 213 of which channel widths are to be changed, may be created as illustrated in FIG. 19. According to example embodiments of inventive concepts, the marking layer ML may be created to correspond to each of the first to third active fins 211, 212, and 213. Although not illustrated, in another embodiment only one marking layer ML indicating a cell including the first to third active fins 211, 212, and 213 may be created.

Figure 20:
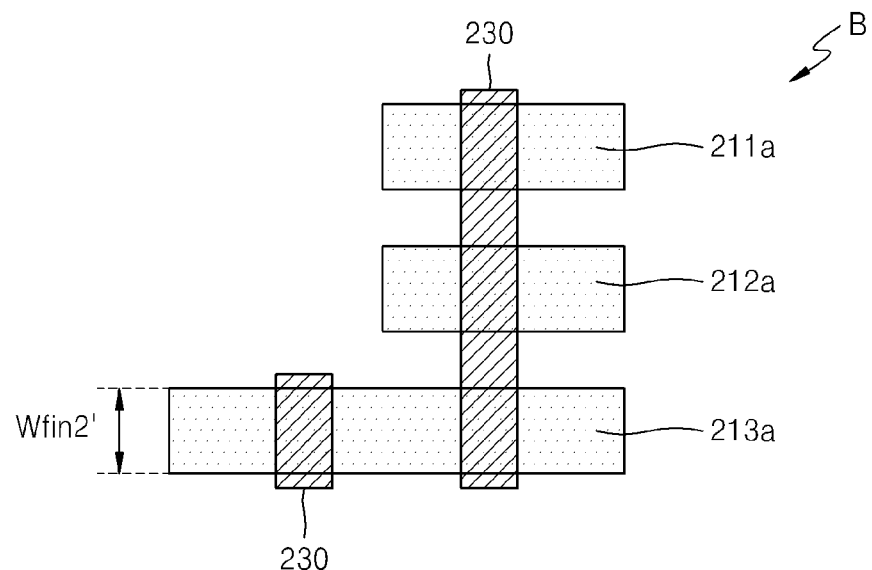
FIG. 20 is a layout of a semiconductor device of which a width is changed based on a new library created using the marking layer of FIG. 19, according to example embodiments of inventive concepts.

FIG. 20 is a layout of a semiconductor device of which a width is changed based on a new library created using the marking layer ML of FIG. 19, according to example embodiments of inventive concepts.

Referring to FIG. 20, a new library of new first to third active fins 211a, 212a, and 213a, each of which a channel width is increased by about 10%, may be created by applying the marking layer ML of FIG. 19 to a previously created existing layout. As a result, the first to third new active fins 211a, 212a, and 213a may each have a new second width Wfin2'. For example, the new second width Wfin2' may be about 15 nm, and a new fin FET including the new first to third active fins 211a, 212a, 213a may have a channel width of about 55 nm.

According to example embodiments of inventive concepts, even with a characteristic change in a semiconductor device, without designing a new layout for the semiconductor device, a new library of the semiconductor device may be created by applying a marking layer to a previously created existing layout and provided to a user. The user may perform a process such as OPC based on the new library to form a photomask, which may be then used in an exposure process to form a wafer pattern according to the new library on a wafer, thereby implementing a semiconductor IC as illustrated in FIG. 20.

Figure 21:
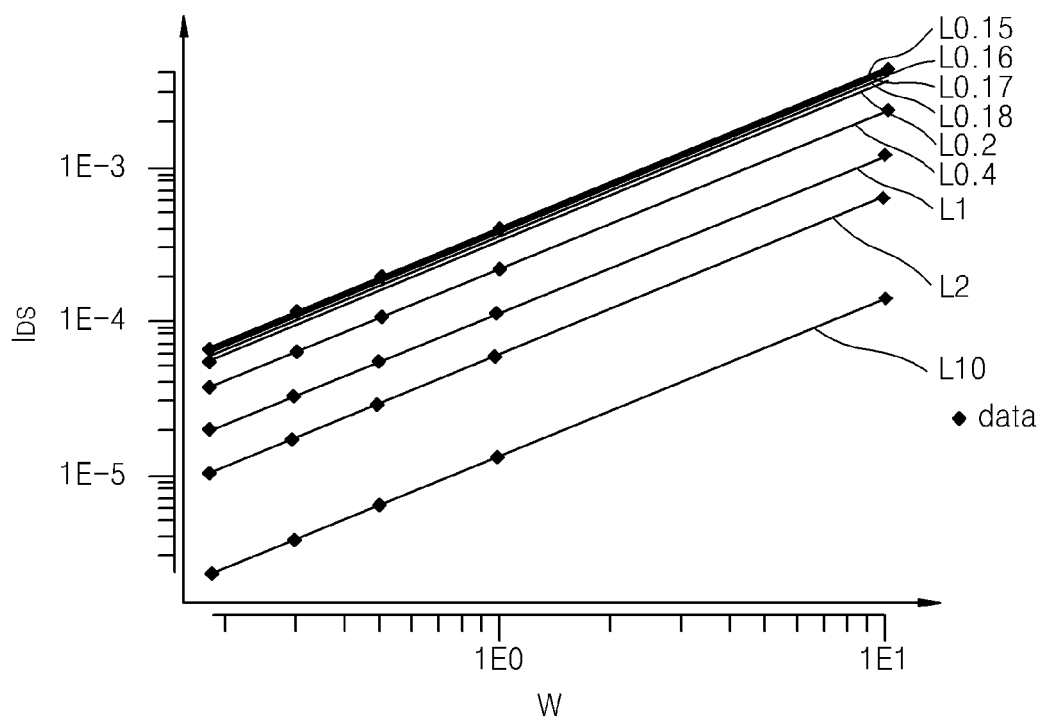
FIG. 21 is a graph of current with respect to width of a semiconductor device of a semiconductor IC, according to example embodiments of inventive concepts.

FIG. 21 is a graph of current with respect to width of a semiconductor device of a semiconductor IC, according to example embodiments of inventive concepts.

Referring to FIG. 21, the X-axis represents a channel width W, and the Y-axis represents current amount IDS. L indicates a channel length, and in particular, L1 indicates a channel length of about 1, and L0.4 indicates a channel length of about 0.4. The channel width W, the current amount IDS, and the channel length L were represented as relative values. When the semiconductor device is a MOS transistor, as shown in FIG. 21, a current amount flowing through the MOS transistor may increase linearly in proportion to the channel width W, and may increase in proportion to the inverse of the channel length L. The current amount flowing in the MOS transistor may be represented using Equation 1 and Equation 2.

$$i = \frac{1}{2}(\mu n \cdot Cox)(W/L)(vGS - Vt)2 \quad \text{[Equation 1]}$$

$$i = \frac{1}{2}(\mu n \cdot Cox)(W/L)[(vGS - Vt)vDS - \frac{1}{2}vDS2] \quad \text{[Equation 2]}$$

wherein i indicates current amount flowing in the MOS transistor, and in particular, [Equation 1] represents a current amount flowing in the MOS transistor in a saturation region, and [Equation 2] represents a current amount flowing in the MOS transistor in a triode region, vGS indicates a gate-source voltage, vDS indicates a drain-source voltage, and Vt indicates a threshold voltage. Cox indicates capacitance per unit gate area, and μn·Cox is a process transduction parameter, which is determined according to the manufacturing technology.

According to example embodiments of inventive concepts, a semiconductor IC design method may create a new library of a semiconductor device that is changed in at least one of width, height, and space from an adjacent semiconductor device, based on a change in characteristics of the semiconductor device, for example, in electrical or thermal characteristics of the semiconductor device. Based on the changes in current amount with respect to channel width and channel length of a transistor, as shown in FIG. 21, the channel width and channel length of the transistor may be changed according to a user's needs and/or desired criteria. In this regard, a marking layer indicating a transistor to be changed in length may be created and then be applied to an existing layer, so that a new library may be rapidly created.

Figure 22:
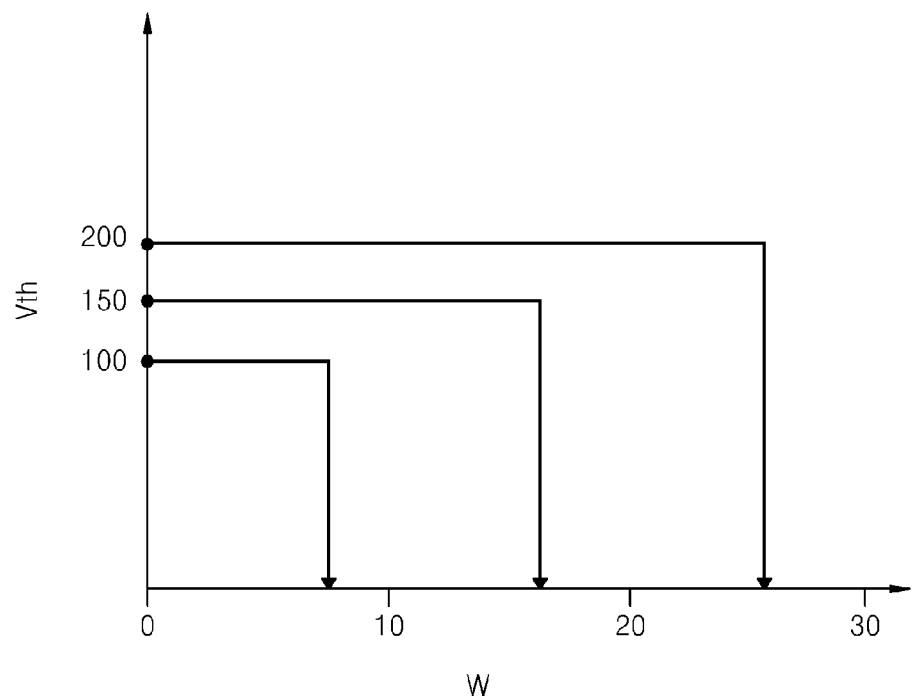
FIG. 22 is a graph of threshold voltage with respect to width of a semiconductor device of a semiconductor IC, according to example embodiments of inventive concepts.

FIG. 22 is a graph of threshold voltage with respect to width of a semiconductor device of a semiconductor IC, according to example embodiments of inventive concepts.

Referring to FIG. 22, the X-axis represents a channel width of a semiconductor device, for example, a channel width W of a fin FET, and the Y-axis represents a threshold voltage (Vth) of a semiconductor device, for example, a threshold voltage Vth of the fin FET. The X-axis and Y-axis represent normalized values of the channel width W and the threshold voltage Vth, respectively. Hereinafter, an example embodiment of inventive concepts using a fin FET as the semiconductor device will be described.

In general, defining active regions to have different impurity doping concentrations may be used to manufacture a plurality of transistors having different threshold voltages. However, only defining active regions that have different impurity doping concentrations is not enough to manufacture a plurality of fin FETs having different threshold voltages. To manufacture a plurality of fin FETs having different threshold voltages, channel widths of the plurality of fin FETs need to be set differently.

As shown in FIG. 22, the larger the channel width Wfin of the fin FET becomes, the higher the threshold voltage Vth becomes. The increase in threshold voltage Vth may lead to degradation in performance of the fin FET, but may reduce leakage current. A reduction in threshold voltage Vth may increase leakage current of the fin FET, but may improve the performance of the fin FET. Therefore, the threshold voltage Vth of the fin FET may be appropriately adjusted according to a user's demand and/or desired criteria. To this end, the channel width of the fin FET may need to be appropriately changed.

With the assumption that an active fin width of a fin FET is set to about 12 in a previously created existing layout, to reduce the threshold voltage Vth of the fin transistor, it may be determined to change the active fin width of the fin FET, for example, by about −4. A marking layer indicating an active fin of which a width is to be changed may be created, and may then be applied to the previously created existing layout to create a new library of an active fin of which a width is changed by about −4.

With the assumption that an active fin width of a fin FET is set to about 12 in a previously created existing layout, to increase the threshold voltage Vth of the fin FET, it may be determined to change the active fin width of the fin FET, for example, by about +4. A marking layer indicating an active fin of which a width is to be changed may be created, and may then be applied to the previously created existing layout to create a new library of an active fin of which widths is changed by about +4.

Hereinafter, a method of designing a fin FET having multiple threshold voltages and a fin FET manufactured using the method will be described with reference to FIGS. 23 to 27.

Figure 23:
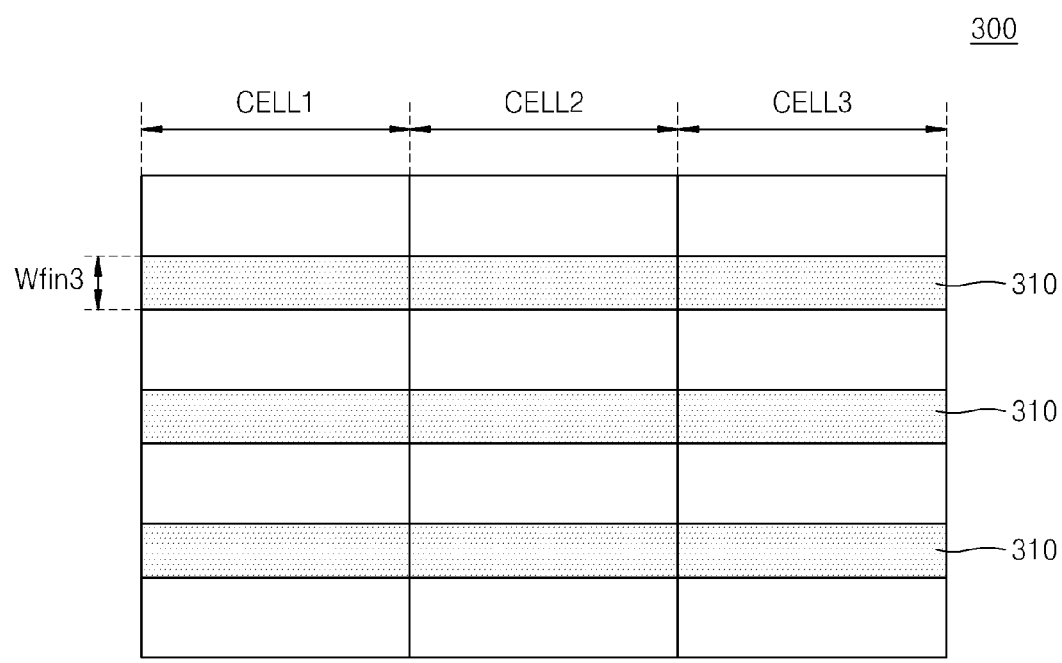
FIG. 23 is a layout of a semiconductor IC according to example embodiments of inventive concepts.

FIG. 23 is a layout of a semiconductor IC 300 according to example embodiments of inventive concepts.

Referring to FIG. 23, the semiconductor IC 300 may include first to third cells CELL1, CELL2, and CELL3 arranged adjacent to one another. The first to third cells CELL1, CELL2, and CELL3 may include a plurality of adjacent active fins 310, which may each have a third width Wfin3. The first to third cells CELL1, CELL2, and CELL3 may have the same threshold voltage. For convenience of illustration, a gate electrode and source/drain contacts are excluded in FIG. 23. In FIG. 23, which is a two-dimensional layout, the height information of the plurality of active fins 310 in the first to third cells CELL1, CELL2, and CELL3 is not presented.

According to example embodiments of inventive concepts, in a semiconductor IC design method, when it is determined to change a threshold voltage of the second cell CELL2 selected from among the first to third cells CELL1, CELL2, and CELL3 to a desired (and/or alternatively predetermined) level, the widths of the active fins 310 in the second cell CELL2 may be changed based on the graph of FIG. 22. In particular, a marking layer indicating the active fins 310 in the second cell CELL2 may be created, and then be applied to a previously created existing layout to create a new library of the active fins 310 of the second cell CELL2 with changed widths.

According to example embodiments of inventive concepts, the semiconductor IC 300 may be designed using the above-described semiconductor IC design method. In particular, the semiconductor IC 300 may be designed using the above-described library design method, according to the new library of the semiconductor device with a changed width. According to example embodiments of inventive concepts, the new library may be created by creating a marking layer for the semiconductor device that indicates a semiconductor device of which a width is to be changed, based on a change in characteristics of the semiconductor device, and applying the created marking layer to the previously created existing layout. Hereinafter, embodiments of designing the semiconductor IC 300 based on the new library will be described with reference to FIGS. 23 to 27.

Figure 24:
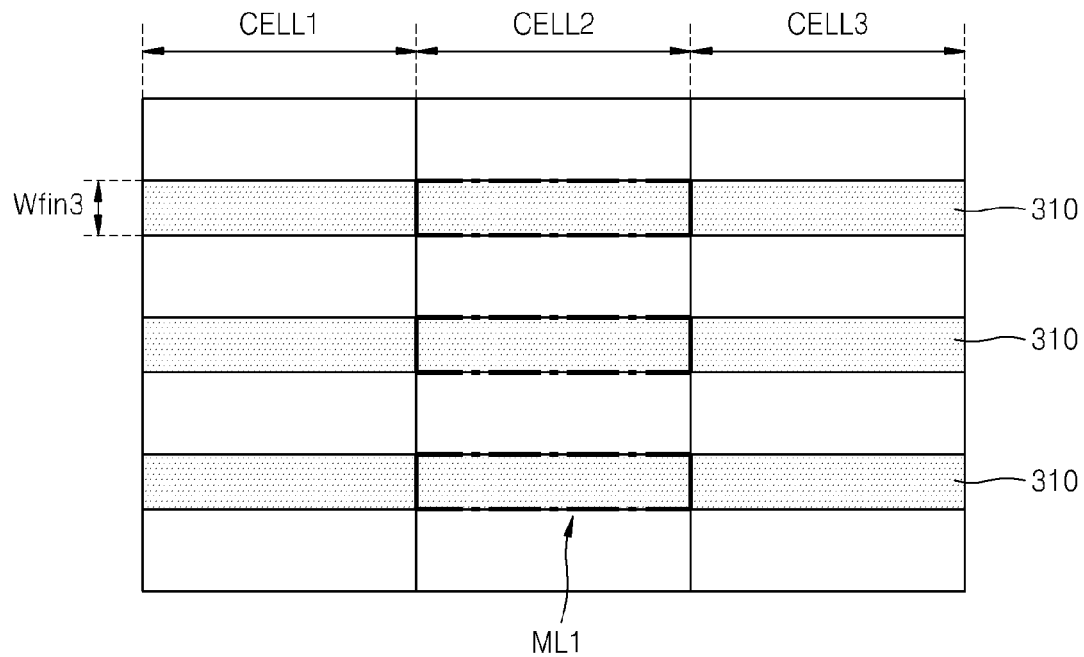
FIG. 24 illustrates a marking layer applied to the layout of FIG. 23, according to example embodiments of inventive concepts.

FIG. 24 illustrates the layout of the semiconductor device 300a after a marking layer ML1 is applied to the layout of FIG. 23, according to example embodiments of inventive concepts.

Referring FIG. 24, when it is determined to change the widths of the active fins 310 in the second cell CELL2 based on the different threshold voltages of the first, second, and third cells CELL1, CELL2, and CELL3, a first marking layer ML1 indicating the plurality of active fins 310 of the second cell CELL2 may be created. The first marking layer ML1 may be created to correspond to each of the plurality of active fins 310. According to example embodiments of inventive concepts, the first marking layer ML1 may also be referred to as an annotation layer.

For example, the third width Wfin3 may be about 12 nm. To increase the threshold voltage of the second cell CELL2, it may be determined to increase the width of each active layer 310 in the second cell CELL2 by about +4. To this end, instead of designing a new layout, the first marking layer ML1 indicating the plurality of active fins 310 of the second cell CELL2 of which widths are to be changed may be created as illustrated in FIG. 24.

Figure 25:
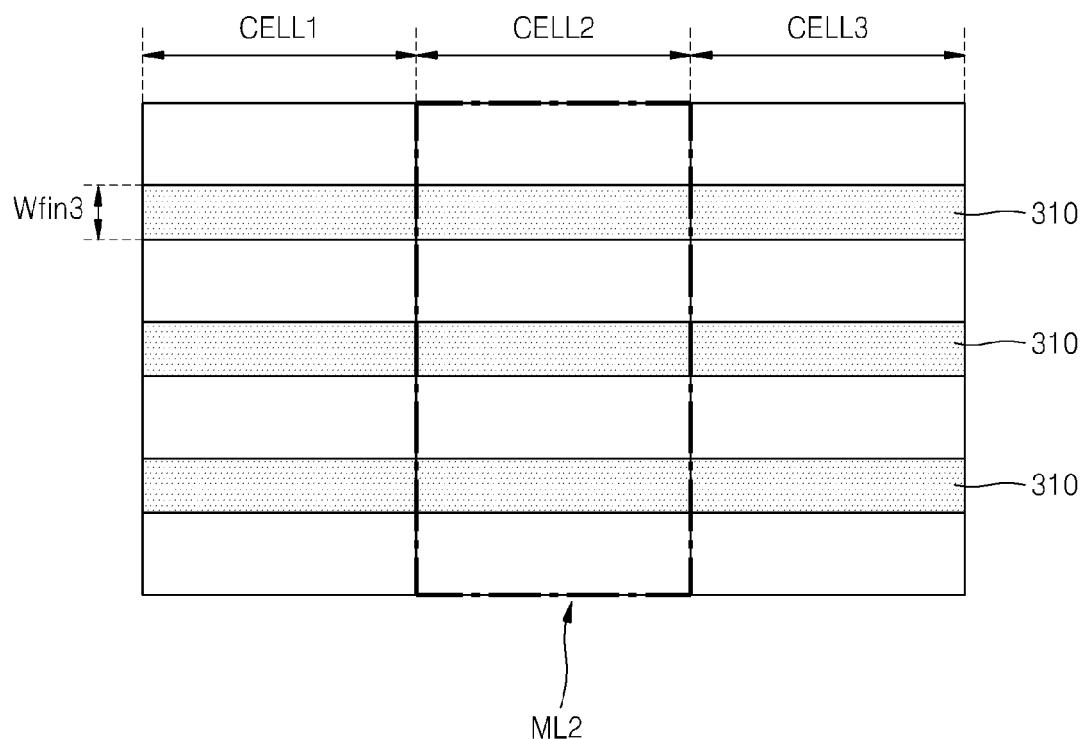
FIG. 25 illustrates a marking layer applied to the layout of FIG. 23, according to example embodiments of inventive concepts.

FIG. 25 illustrates the layout of the semiconductor device 300b after a marking layer ML2 is applied to the layout of FIG. 23, according to example embodiments of inventive concepts.

Referring FIG. 25, when it is determined to change the widths of the active fins 310 in the second cell CELL2 based on the different threshold voltages of the first, second, and third cells CELL1, CELL2, and CELL3, a second marking layer ML2 indicating the plurality of active fins 310 of the second cell CELL2 may be created. The second marking layer ML2 may be created to correspond to the second cell CELL2 including the plurality of active fins 310. The second marking layer ML2 may be marked at a cell boundary of the second cell CELL2. According to example embodiments of inventive concepts, the second marking layer ML2 may also be referred as an annotation layer.

For example, the third width Wfin3 may be about 12 nm. To increase the threshold voltage of the second cell CELL2, it may be determined to increase the width of each active layer 310 in the second cell CELL2 by about +4. To this end, instead of designing a new layout, the second marking layer ML12 indicating the plurality of active fins 310 of the second cell CELL2 of which widths are to be changed may be created as illustrated in FIG. 25.

Figure 26:
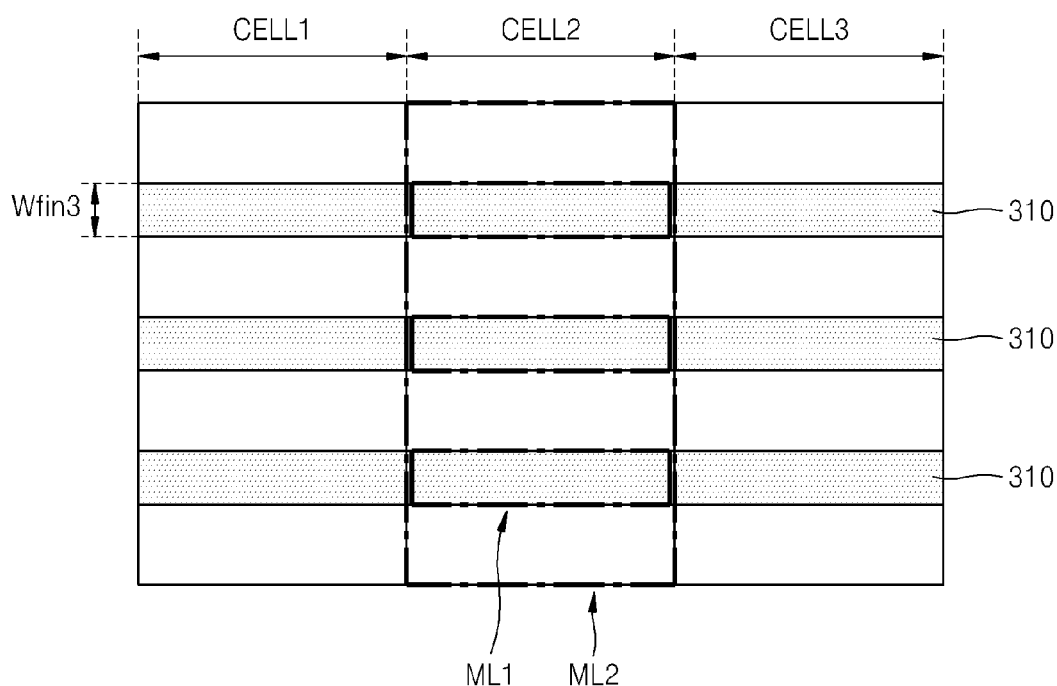
FIG. 26 illustrates a marking layer applied to the layout of FIG. 23, according to example embodiments of inventive concepts.

FIG. 26 illustrates a layout of the semiconductor device 300c after marking layers ML1 and ML2 are applied to the layout of FIG. 23, according to example embodiments of inventive concepts.

Referring FIG. 26, when it is determined to change the widths of the active fins 310 in the second cell CELL2 based on the different threshold voltages of the first, second, and third cells CELL1, CELL2, and CELL3, first and second marking layers ML1 and ML2 indicating the plurality of active fins 310 of the second cell CELL2 may be created. The first marking layer ML1 may be created to correspond to each of the plurality of active fins 310. The second cell ML2 may be created to correspond to the second cell CELL2 including the plurality of active fins 310. The second marking layer ML2 may be marked at a cell boundary of the second cell CELL2. According to example embodiments of inventive concepts, the first and second marking layers ML1 and ML2 may also be referred as annotation layers.

For example, the third width Wfin3 may be about 12 nm. To increase the threshold voltage of the second cell CELL2, it may be determined to increase the width of each active layer 310 in the second cell CELL2 by about +4. To this end, instead of designing a new layout, the first and second making layers ML1 and ML2 indicating the plurality of active fins 310 of the second cell CELL2 of which widths are to be changed may be created as illustrated in FIG. 26.

Figure 27:
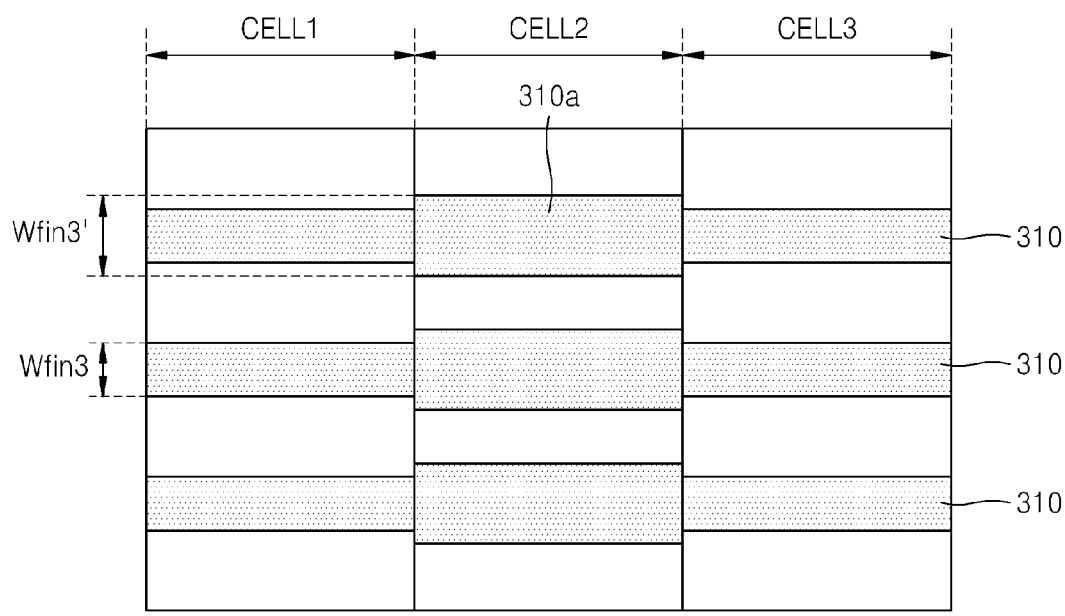
FIG. 27 is a layout of a semiconductor device of which a width is changed based on a new library created using one of the marking layers of FIGS. 24 to 26, according to example embodiments of inventive concepts.

FIG. 27 is a layout of a semiconductor device 300d of which a width is changed based on a new library created using one of the marking layers of FIGS. 24 to 26, according to example embodiments of inventive concepts.

Referring to FIG. 27, a new library of new active fins 310a of the second cell CELL2 of which widths are increased by about +4 may be created by applying one of the marking layers of FIGS. 24 to 26 to a previously created existing layout. As a result, the new active fins 310a may each have a new third width Wfin3'.

According to example embodiments of inventive concepts, a new library for changing all the active fins 310 of the second cell CELL2 to the new active fins 310a may be created. Alternatively, a new library for changing at least one of the active fins 310 in the second cell CELL2 to a new active fin 310a may be created. Alternatively, a new library for changing at least one of the active fins 310 in at least one of the first, second, and third cells CELL1, CELL2, and CELL3 to a new active fin 310a may be created.

According to example embodiments of inventive concepts, even with a characteristic change in a semiconductor device, without designing a new layout for the semiconductor device, a new library of the semiconductor device may be created by applying a marking layer to a previously created existing layout and provided to a user. The user may perform a process such as OPC based on the new library to form a photomask, which may be then used in an exposure process to form a wafer pattern according to the new library on a wafer, thereby implementing a semiconductor IC as illustrated in FIG. 27.

Figure 28:
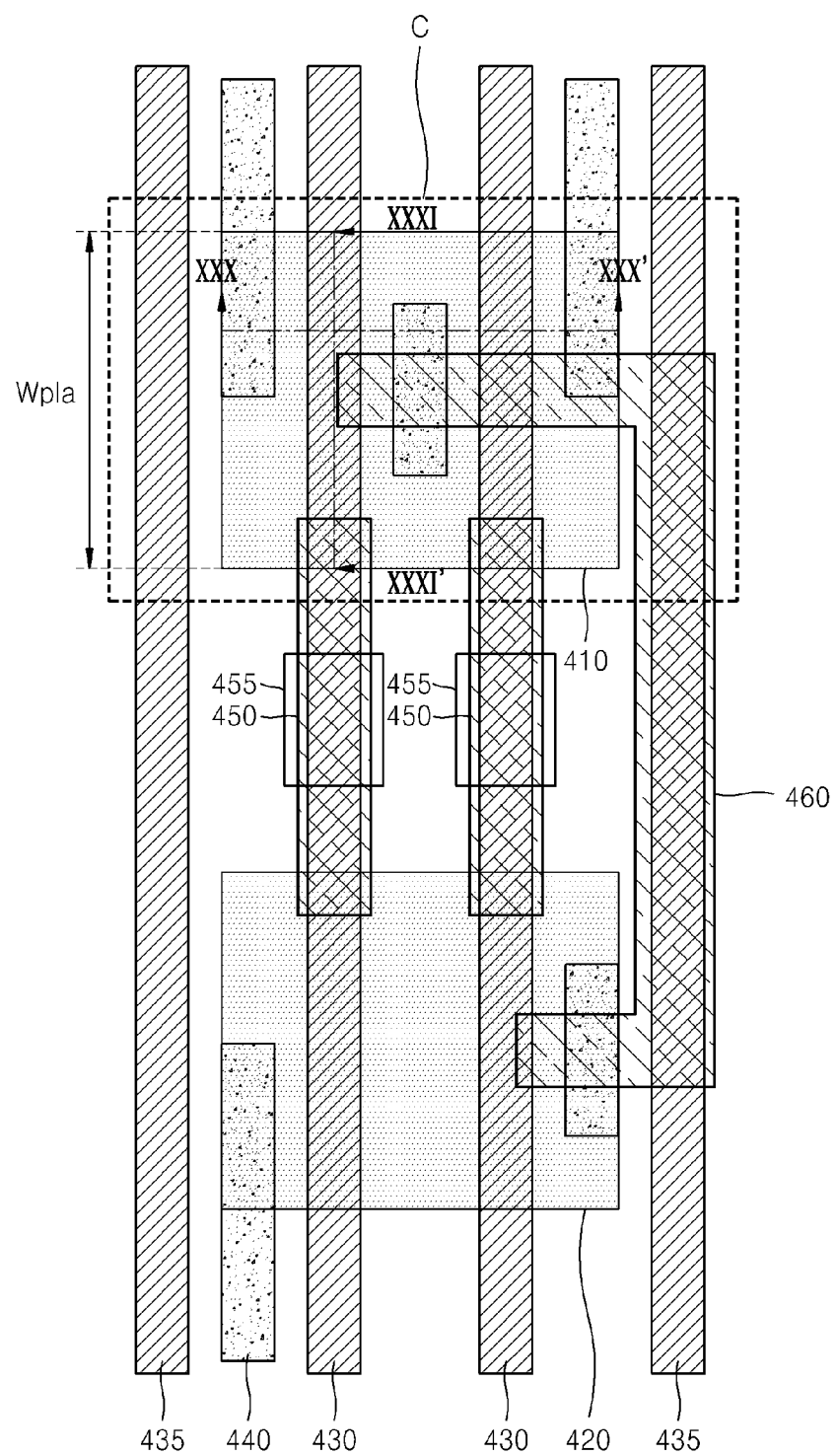
FIG. 28 is a layout of a semiconductor IC according to example embodiments of inventive concepts.

FIG. 28 is a layout of a semiconductor IC 400 according to example embodiments of inventive concepts. In particular, FIG. 28 mainly illustrates an example of a standard cell of the semiconductor IC 400.

Referring to FIG. 28, the semiconductor IC 400 may include first and second active regions 410 and 420, a plurality of gate electrodes 430, a plurality of dummy gate electrodes 435, a plurality of source/drain contacts 440, two input terminals 450, two source/drain contacts 455, and an output terminal 460. According to example embodiments of inventive concepts, the semiconductor IC 400 may include planar transistors.

Firstly, the first and second active regions 410 and 420 may be previously formed on a semiconductor substrate (not shown) through a single process. Subsequently, a plurality of gate electrodes, including the plurality of gate electrodes 430 and the plurality of dummy gate electrodes 435, and the plurality of source/drain contacts 440 may be formed. Next, the two input terminals 450 and the output terminal 460 may be formed.

The first and second active regions 410 and 420 may have a fourth width Wplas that may be adaptively and continuously changed according to a design. The plurality of gate electrodes 430 and the plurality of source/drain contacts 440 are disposed above the first active region 410, so that, for example, two PMOS transistors connected in parallel may be formed. The plurality of gate electrodes 430 and the plurality of source/drain contacts 440 are disposed above the second active region 420, so that, for example, two NMOS transistors connected in parallel may be formed. However, the inventive concept is not limited thereto.

According to example embodiments of inventive concepts, the semiconductor IC 400 may be designed using the above-described semiconductor IC design method. In particular, the semiconductor IC 400 may be designed using the above-described library design method, according to the new library of the semiconductor device with a changed width. According to example embodiments of inventive concepts, the new library may be created by creating a marking layer for the semiconductor device that indicates a semiconductor device of which a width is to be changed, based on a change in characteristics of the semiconductor device, and applying the created marking layer to the previously created existing layout. Hereinafter, embodiments of designing the semiconductor IC 400 based on the new library will be described with reference to FIGS. 29 to 34.

Figure 29:
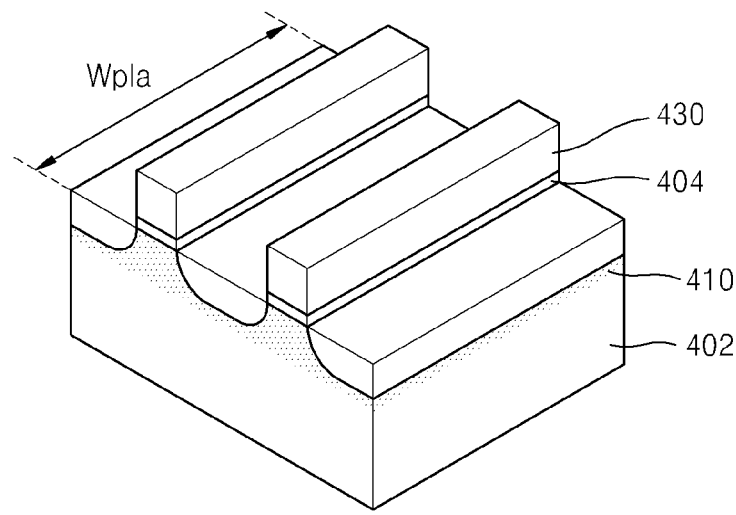
FIG. 29 is a perspective view of a semiconductor device with the layout of FIG. 28, according to example embodiments of inventive concepts.

FIG. 29 is a perspective view of a semiconductor device 400a having the layout of FIG. 28, according to example embodiments of inventive concepts.

Figure 30:
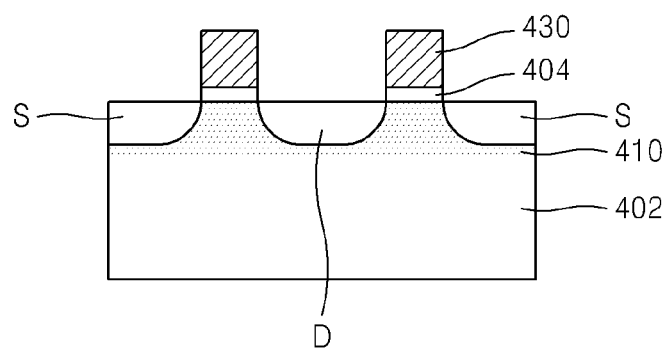
FIG. 30 is a cross-sectional view taken along line XXX-XXX' of FIG. 28.

FIG. 30 is a cross-sectional view taken along line XXX-XXX' of FIG. 28.

Figure 31:
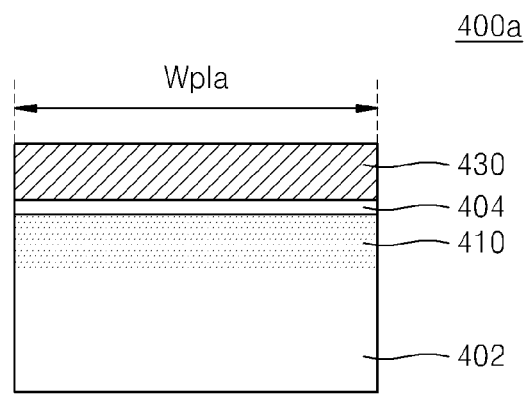
FIG. 31 is a cross-sectional view taken along line XXXI-XXXI' of FIG. 28.

FIG. 31 is a cross-sectional view taken along line XXXI-XXXI' of FIG. 28.

Referring to FIGS. 29 to 31, the semiconductor device 400a may include a substrate 402, an insulating layer 404, and a plurality of gate electrodes 430. According to example embodiments of inventive concepts, the semiconductor device 400a may be a planar transistor.

The substrate 402 may be a semiconductor substrate, for example, including one of silicon, silicon-on-insulator (SOI), silicon-on-sapphire (SOS), germanium, silicon-germanium, and gallium-arsenide.

A first active region 410 may be arranged to be connected with the substrate 402. According to example embodiments of inventive concepts, the first active region 410 may be an n+ or p+ doped active region in an upper region of the substrate 402. The first active region 410 may have a fourth width Wplas that may be adaptively and continuously changed according to design. For example, the first active region 410 may have a fourth width Wpla that may be changeable in a range of from about 60 nm to about 169 nm by 1 nm.

The insulating layer 404 may include an insulating material, for example, which may include one of an oxide layer, a nitride layer, and an oxynitride layer. The insulating layer 404 may be arranged on the first active region 410. The insulating layer 404 may be disposed between the first active region 410 and the gate electrode 430, and thus, may serve as a gate insulating layer.

The plurality of gate electrodes 430 may be arranged on the insulating layer 404 and between source region S and drain region D. Thus, a planar transistor may be implemented. The plurality of gate electrodes 430 may include at least one of a metallic material such as tungsten (W) and tantalum (Ta), a nitride thereof, a silicide thereof, and a doped polysilicon, and may be formed using a deposition process.

Figure 32:
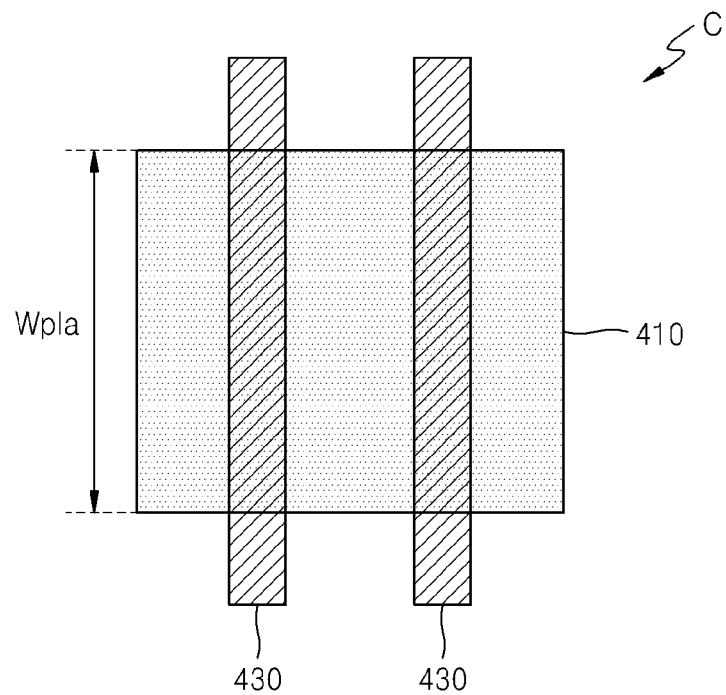
FIG. 32 is a layout of a region C in FIG. 28.

FIG. 32 is a layout of a region C in FIG. 28.

Referring to FIG. 32, the region C includes the first active region 410 and the gate electrodes 430. For convenience of illustration, the source/drain contacts 440, the two input terminals 450, and the output terminal 460 in the region C of FIG. 28 are excluded in FIG. 32.

In a semiconductor IC design method according to example embodiments of inventive concepts, when the first active region 410 is determined to have a width increased by about 10%, a marking layer indicating the first active region 410 may be created, and then be applied to a previously created existing layout, thereby creating a new library of the semiconductor device with a changed channel width.

Figure 33:
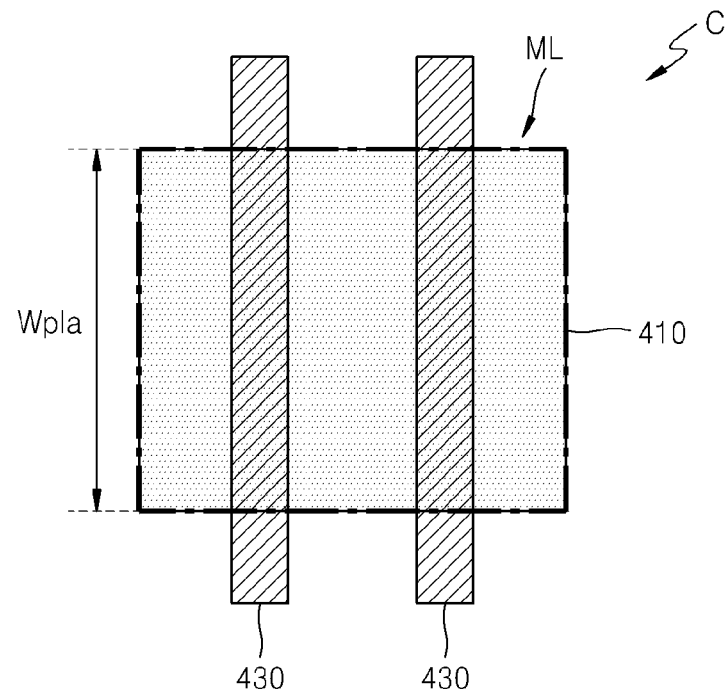
FIG. 33 illustrates a marking layer applied to the layout of FIG. 32, according to example embodiments of inventive concepts.

FIG. 33 illustrates a marking layer ML applied to the layout of FIG. 32, according to example embodiments of inventive concepts.

Referring to FIG. 33, when the first active region 410 is determined to have a width increased by about 10%, the marking layer ML indicating the first active region 410 may be created. The marking layer ML may be created to correspond to the first active region 410. According to example embodiments of inventive concepts, the marking layer ML may also be referred as an annotation layer.

For example, when the first active region 410 has a fourth width Wpla of about 60 nm, the planar transistor may have a channel width of about 60 nm.

When the first active region 410 is determined to have a width increased by about 10%, the width of the first active region 410 may need to be increased by about 6 nm.

To this end, instead of designing a new layout, a marking layer ML indicating the first active region 410 of which a width is to be changed may be created as illustrated in FIG. 33. According to example embodiments of inventive concepts, the marking layer ML may be created to correspond to the first active region 410. Although not illustrated, in another embodiment, a marking layer ML for a cell including the active region 410 may be created.

Figure 34:
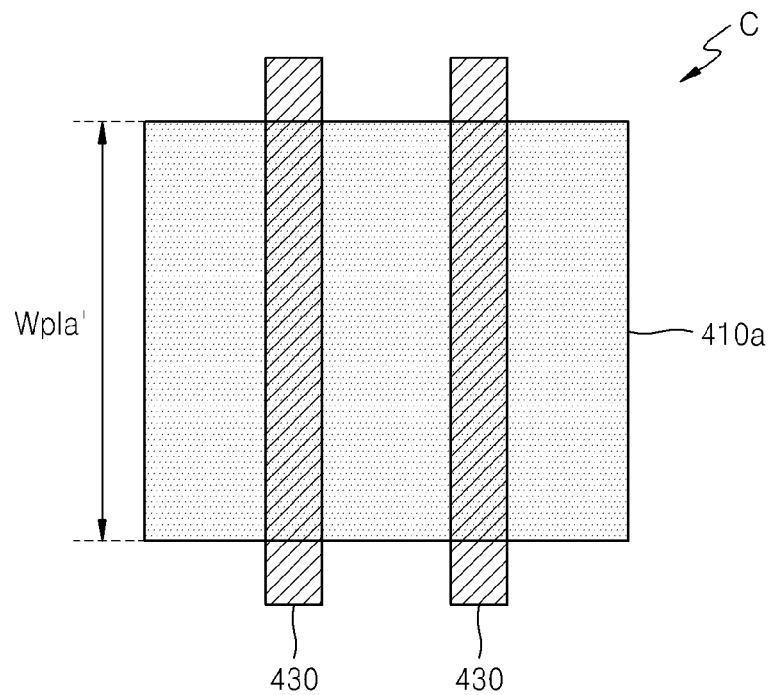
FIG. 34 is a layout of a semiconductor device of which a width is changed based on a new library created using the marking layer of FIG. 33, according to example embodiments of inventive concepts.

FIG. 34 is a layout of a semiconductor device of which a width is changed based on a new library created using the marking layer ML of FIG. 33, according to example embodiments of inventive concepts.

Referring to FIG. 34, a new library of a new first active region 410a of which a width is increased by about 10% may be created by applying the marking layer ML of FIG. 33 to a previously created existing layout. As a result, the width of the new first active region 410a may be changed to a new fourth width Wpla'. For example, the new fourth width Wpla' may be about 66 nm, and the planar transistors formed in the new fourth active region 410a may each have a channel width of about 66 nm.

According to example embodiments of inventive concepts, even with a characteristic change in a semiconductor device, without designing a new layout for the semiconductor device, a new library of the semiconductor device may be created by applying a marking layer to a previously created existing layout and provided to a user. The user may perform a process such as OPC based on the new library to form a photomask, which may be then used in an exposure process to form a wafer pattern according to the new library on a wafer, thereby implementing a semiconductor IC as illustrated in FIG. 34.

Figure 35:
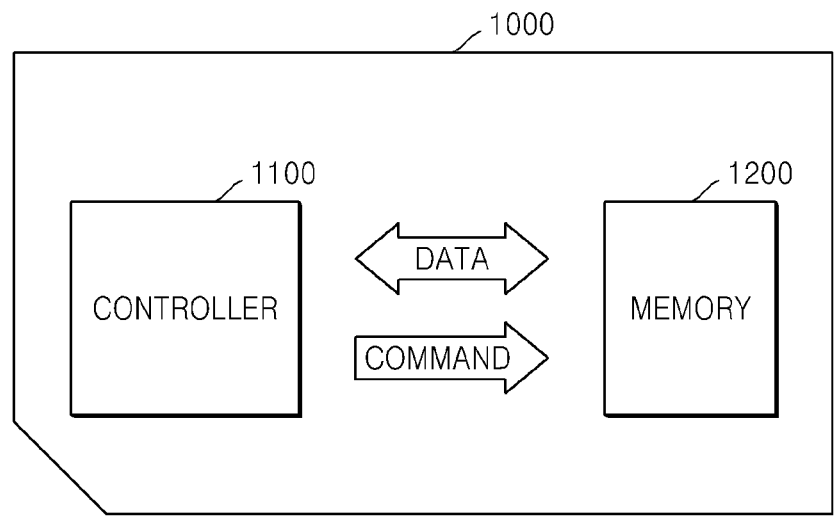
FIG. 35 is a schematic diagram of a memory card including a semiconductor IC according to example embodiments of inventive concepts.

FIG. 35 is a schematic diagram of a memory card 1000 including a semiconductor IC according to example embodiments of inventive concepts.

The memory card 1000 may include a controller 1100 and a memory 1200 that may exchange electric signals with each other. For example, when the controller 1100 transmits a command to the memory 1200, the memory 1200 may transmit data to the controller 1100.

The controller 1100 and the memory 1200 may include a semiconductor IC according to example embodiments of inventive concepts. For example, a width of at least one of a plurality of semiconductor devices in the controller 1100 and the memory 1200 may be changed based on a new library using a marking layer created based on a characteristic change in at least one of the semiconductor devices. The controller 110 and the memory 1200 may include semiconductor devices, for example, transistors, according to example embodiments of inventive concepts described above.

The memory card 1000 may include any of a variety of memory cards, for example, a memory stick card, a smart media (SM) card, a secure digital (SD) card, a mini SD card, and a multimedia card (MMC). However, example embodiments of inventive concepts are not limited thereto.

Figure 36:
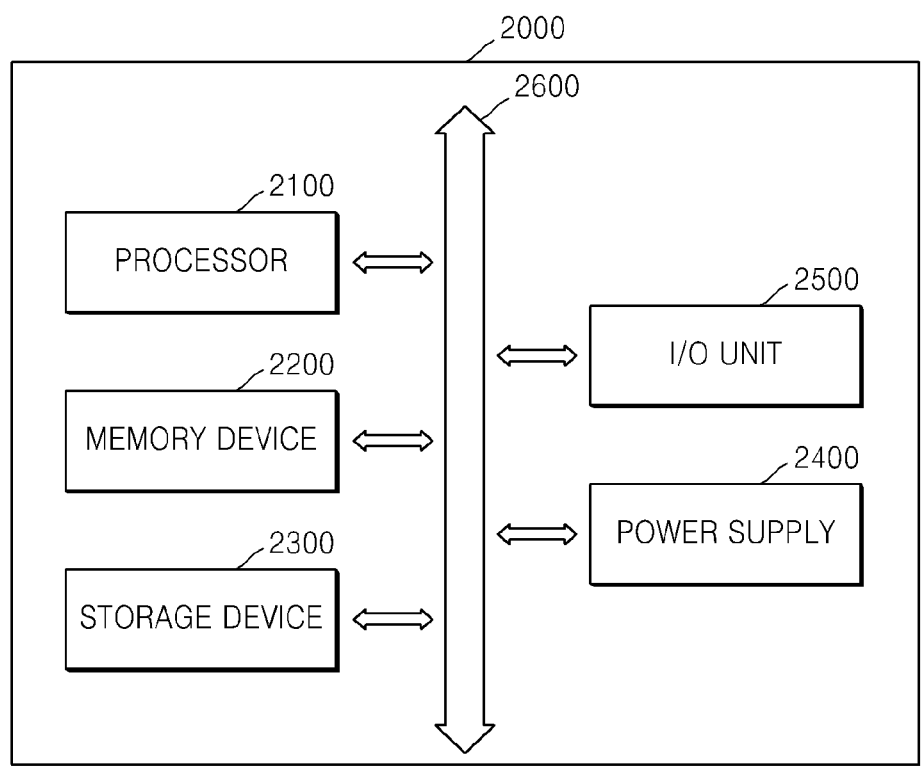
FIG. 36 is a schematic diagram of a computing system including a semiconductor IC according to example embodiments of inventive concepts.

FIG. 36 is a schematic diagram of a computing system 2000 including a semiconductor IC according to example embodiments of inventive concepts.

Referring to FIG. 36, the computing system 2000 may include a processor 2100, the memory device 2200, a storage device 2300, a power supply 2400, and an input/output (I/O) unit 2500. Although not illustrated in FIG. 36, the computing system 2000 may further include ports for communication with a video card, a sound card, a memory card, or a USB, or with other electronic devices.

The processor 2100, the memory device 2200, the storage device 2300, the power supply 2400, and the I/O unit 2500 in the computing system 2000 may include a semiconductor IC according to embodiments of the inventive concept. In particular, a width of at least one of a plurality of semiconductor devices in the processor 2100, the memory device 2200, the storage device 2300, the power supply 2400, and the I/O unit 2500 may be changed based on a new library using a marking layer created based on a characteristic change in at least one of the semiconductor devices. The processor 2100, the memory device 2200, the storage device 2300, the power supply 2400, and the I/O unit 2500 in the computing system 2000 may include semiconductor devices, for example, transistors, according to example embodiments of inventive concepts described above.

The processor 2100 may perform specific computations or tasks. The processor 2100 may be a micro-processor, a central processing unit (CPU), or the like. The processor 2100 may communicate with the memory device 2200, the storage device 2300, and the I/O unit 2500 via a bus 2600, for example, an address bus, a control bus, and a data bus. According to example embodiments of inventive concepts, the processor 2100 may be connected with an extended bus, such as a peripheral component interconnect (PCI) bus.

The memory device 2200 may store data used for operation of the computing system 2000. For example, the memory device 2200 may be implemented as a DRAM, a mobile DRAM, an SRAM, a PRAM, an FRAM), an RRAM and/or an MRAM. The storage device 2300 may include, for example, a solid state drive, a hard disk drive, or a CD-ROM.

The I/O unit 2500 may include an input unit such as a keyboard, a keypad, or a mouse, and an output unit such as a printer or a display. The power supply 2400 may supply an operating voltage to the computing system 2000.

Semiconductor ICs according to example embodiments of inventive concepts may be implemented as any of a variety of package forms. For example, at least some elements of the semiconductor IC chip may be mounted using packages, for example, Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack(MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

In a semiconductor IC design method according to example embodiments of inventive concepts, a marking layer indicating a semiconductor device that is to be changed in at least one of width, height, and space from an adjacent semiconductor device may be created based on a change in characteristics of the semiconductor device, and the marking layer may be applied to a previously created layout to create a new library of the semiconductor device that is changed in the at least one of width, height, and space from an adjacent semiconductor device. Therefore, even with the change in characteristic of the semiconductor device, creating a new layout is unnecessary, so that the time and costs taken in designing the semiconductor IC circuit may be reduced.

Furthermore, rapid development of a variety of libraries based on changes in characteristics of semiconductor devices, and provision thereof to a user may improve user convenience. The variety of libraries may store an enriched pool of various kinds of cells, so that designing of semiconductor ICs may become more flexible, with more likely an optimal design.

While some example embodiments have been particularly shown and described, it will be understood by one of ordinary skill in the art that variations in form and detail may be made therein without departing from the spirit and scope of the claims.

What is claimed is:

1. A method of designing a semiconductor integrated circuit using a semiconductor integrated circuit (IC) design apparatus, the method comprising:

accessing a first layout of a semiconductor IC from a layout database of the semiconductor IC design apparatus, the first layout stored in the layout database, the first layout including a plurality of cells arranged adjacent to each other, each one of the plurality of cells indicating structural features in the semiconductor IC in a corresponding part of semiconductor IC;

creating a marking layer using a marking layer creation unit of the semiconductor IC design apparatus, the marking layer indicating at least one structural feature of the structural features in the semiconductor IC that is to be changed in at least one of width, height, and space thereof from an adjacent structural feature of the structural features in the semiconductor IC, the marking layer being based on a change in characteristics of at least one semiconductor device defined by at least one of the structure features in the semiconductor IC; and generating a second layout of the semiconductor IC by applying the marking layer using a library creation unit of the semiconductor IC design apparatus to a selected cell of the plurality of cells in the first layout; and generating a new library of the semiconductor IC from the second layout, the new library indicating the at least one structure feature of the structural features in the semiconductor IC that is changed in at least one of width, height, and space from the adjacent structural feature in the semiconductor IC.

2. The method of claim 1, wherein the change in characteristics of the at least one semiconductor device is a change in at least one of electrical and thermal characteristics of the at least one semiconductor device.

3. The method of claim 1, wherein according to the created new library, the plurality of cells have a constant pitch even when the width of the at least one structural feature is changed.

4. The method of claim 1, wherein the creating of the marking layer comprises at least one of:
creating a first marking layer using the marking layer creation unit, the first marking layer indicating the at least one structural feature of the structural features in the semiconductor IC that is to be changed in at least one of width, height, and space thereof; and
creating a second marking layer using the marking layer creation unit, the second marking layer indicating the selected cell of the plurality of cells including the at least one structural feature of the structural features in the semiconductor IC that is to be changed in at least one of width, height, and space thereof.

5. The method of claim 4, wherein the creating of the second marking layer comprises creating the second marking layer so the second marking layer indicates a boundary of the selected cell.

6. The method of claim 1, wherein
the at least one semiconductor device includes a fin field-effect transistor (fin FET),
the fin field-effect transistor includes a plurality of active fins, and
the creating the marking layer includes indicating at least one of the plurality of active fins that is to be changed in width as the at least one structure feature of the structural features in the semiconductor IC that is to be changed.

7. The method of claim 6, wherein the creating of the marking layer comprises at least one of:
creating a first marking layer using the marking layer creation unit, the first marking layer indicating the at least one of the plurality of active fins that is to be changed in width; and
creating a second marking layer using the marking layer creation unit, the second marking layer indicating the selected cell.

8. The method of claim 6, wherein according to the new library, the plurality of active fins have a constant pitch even when the width of the at least one active fin is changed.

9. The method of claim 1, wherein
the at least one semiconductor device includes a fin field-effect transistor (fin FET), and
the fin field-effect transistor includes a single active fin.

10. The method of claim 1, wherein
the structural features of the semiconductor IC in the first layout define a plurality of fin transistors having fin widths, respectively,
at least one of the plurality of fin transistors is in the selected cell of the first layout, and
the creating the marking layer includes creating the marking layer so the marking layer indicates a width change to the fin widths of the at least one of the plurality of fin transistors in the selected cell as the at least one structural feature of the structural features in the semiconductor IC that is to be changed,
the generating the second layout includes applying the marking layer to the at least one of the plurality of fin transistors in the selected cell,
the generating the new library of the semiconductor IC from the second layout includes adjusting the fin widths of the at least one of the plurality of fin transistors in the selected cell so the at least one of the plurality of fin transistors in the selected cell have different threshold voltages than others of the plurality of fin transistors.

11. The method of claim 10, wherein the creating the marking layer comprises creating the marking layer using the marking layer creation unit to indicate at least one fin transistor of the plurality of fin transistors that is to be changed in width, based on the different threshold voltages.

12. The method of claim 10, wherein the creating the marking layer comprises at least one of:
creating a first marking layer using the marking layer creation unit, the first marking layer indicating the at least one fin transistor in the selected cell of the plurality of fin transistors; and
creating a second marking layer using the marking layer creation unit, the second marking layer indicating the selected cell including the at least one fin transistor.

13. The method of claim 10, wherein
the at least one fin transistor of the plurality of fin transistors comprises a plurality of active fins, and
the creating the marking layer comprises creating the marking layer using the marking layer creation unit, the marking layer indicating at least one active fin of the plurality of active fins that is to be changed in width, based on the different threshold voltages.

14. The method of claim 13, wherein the creating the marking layer comprises at least one of:
creating a first marking layer using the marking layer creation unit, the first marking layer indicating the at least one active fin; and
creating a second marking layer using the marking layer creation unit, the second marking layer indicating the selected cell including the at least one active fin.

15. The method of claim 13, wherein according to the new library, the plurality of active fins have a constant pitch even when the width of the at least one active fin is changed.

16. The method of claim 1, further comprising:
before creating the marking layer, using a layout design unit to determine a variation in characteristics of the at least one semiconductor device based on at least one of a design rule and design constraints.

17. A method of designing a semiconductor integrated circuit using a semiconductor integrated circuit (IC) design apparatus, the method comprising:
accessing a first layout that includes a plurality of semiconductor devices from a layout database of the semiconductor integrated circuit (IC) design apparatus, the first layout including a plurality of cells arranged adjacent to each other;
creating a marking layer using a marking layer creation unit of the semiconductor integrated circuit (IC) design apparatus, the marking layer indicating a dimensional change to at least one semiconductor device of the plurality of semiconductor devices; and
generating a second layout by applying the marking layer to a selected cell of the plurality of cells in the first layout using a library creation unit of the semiconductor integrated circuit (IC) design apparatus, the selected cell including the at least one semiconductor device;

generating from the second layout a new library of the at least one semiconductor device having a dimensional change.

18. The method of claim 17, wherein
the plurality of semiconductor devices in the first layout are a plurality of fin-field effect transistors (fin FETs),
the plurality of fin-field effect transistors (fin FETs) each include a plurality of active fins, and
the creating the marking layer includes at least one of,
creating a first marking layer using the marking layer creation unit, the first marking layer indicating a dimensional change to at least one of the plurality of active fins of a selected fin FET among the plurality of fin FETs, and
creating a second marking layer using the marking layer creation unit, the second marking layer indicating the selected cell of the second layout that includes the selected fin FET among the plurality of fin FETs.

19. The method of claim 17, wherein
the plurality of semiconductor devices in the first layout are a plurality of fin-field effect transistors (fin FETs),
the plurality of fin-field effect transistors (fin FETs) each include one active fin, and the creating the marking layer includes at least one of,
creating a first marking layer using the marking layer creation unit, the first marking layer indicating a dimensional change to the active fins of a selected fin FET among the plurality of fin FETs, and
creating a second marking layer using the marking layer creation unit, the second marking layer indicating the selected cell of the second layout that includes the selected fin FET among the plurality of fin FETs.

20. The method of claim 17, wherein the dimensional change to the at least one semiconductor device of the plurality of semiconductor devices that is indicated by the marking layer corresponds to a change in at least one of width, height, and space thereof from an adjacent semiconductor device.

21. The method of claim 17, wherein the plurality of cells have a constant pitch before and after the dimensional change to the least one semiconductor device of the plurality of semiconductor devices.

22. The method of claim 4, wherein the creating the first marking layer includes creating the first marking layer so the first marking layer corresponds to a periphery of the at least one structural feature of the structural features in the semiconductor IC that is to be changed.

23. The method of claim 17, wherein the creating the marking layer includes creating the marking layer so the marking layer corresponds to a periphery of the at least one semiconductor device of the plurality of semiconductor devices in the first layout that is to have the dimensional change.

* * * * *